(12) United States Patent
Lee et al.

(10) Patent No.: US 11,336,139 B2
(45) Date of Patent: May 17, 2022

(54) AXIAL FIELD ROTARY ENERGY DEVICE WITH PCB STATOR PANEL HAVING THERMALLY CONDUCTIVE LAYER

(71) Applicant: Infinitum Electric, Inc., Round Rock, TX (US)

(72) Inventors: Rich Lee, Liberty Lake, WA (US); Randal A. Lee, Austin, TX (US); Paulo Guedes-Pinto, Round Rock, TX (US)

(73) Assignee: Infinitum Electric, Inc., Round Rock, TX (US)

( * ) Notice: Subject to any disclaimer, the term of this patent is extended or adjusted under 35 U.S.C. 154(b) by 63 days.

(21) Appl. No.: 16/934,729

(22) Filed: Jul. 21, 2020

(65) Prior Publication Data

US 2021/0143697 A1    May 13, 2021

Related U.S. Application Data

(60) Provisional application No. 62/933,598, filed on Nov. 11, 2019, provisional application No. 62/933,795, (Continued)

(51) Int. Cl.
*H02K 3/26*    (2006.01)
*H02K 9/22*    (2006.01)
(Continued)

(52) U.S. Cl.
CPC ........... *H02K 3/26* (2013.01); *H01F 17/0013* (2013.01); *H01F 27/22* (2013.01);
(Continued)

(58) Field of Classification Search
CPC .. H05K 1/0201; H05K 1/0204; H05K 1/0206; H05K 1/0207; H05K 1/115;
(Continued)

(56) References Cited

U.S. PATENT DOCUMENTS 3,230,406 A   1/1966  Henry-Baudot
3,944,857 A   3/1976  Faulhaber
(Continued)

FOREIGN PATENT DOCUMENTS

AU   2016329080 B2   9/2016
CN       1675815       9/2005
(Continued)

OTHER PUBLICATIONS

International Search Report and Written Opinion of the International Searching Authority for PCT Patent Application No. PCT/US18/13145 dated Mar. 15, 2018; 8 pages.
(Continued)

*Primary Examiner* — Tran N Nguyen
(74) *Attorney, Agent, or Firm* — Dickinson Wright, PLLC; Michael E. Noe, Jr.

(57) ABSTRACT

An axial field rotary energy device has a PCB stator panel assembly between rotors with an axis of rotation. Each rotor has a magnet. The PCB stator panel assembly includes PCB panels. Each PCB panel can have layers, and each layer can have conductive coils. The PCB stator panel assembly can have a thermally conductive layer that extends from an inner diameter portion to an outer diameter portion thereof.

31 Claims, 14 Drawing Sheets

Related U.S. Application Data filed on Nov. 11, 2019, provisional application No. 62/960,769, filed on Jan. 14, 2020.

(51) Int. Cl.

| | | |
|---|---|---|
| *H05K 1/16* | (2006.01) | |
| *H02K 1/12* | (2006.01) | |
| *H02K 21/24* | (2006.01) | |
| *H02K 11/26* | (2016.01) | |
| *H02K 11/30* | (2016.01) | |
| *H01F 17/00* | (2006.01) | |
| *H01F 27/22* | (2006.01) | |
| *H01F 27/28* | (2006.01) | |
| *H02K 1/18* | (2006.01) | |
| *H05K 1/02* | (2006.01) | |
| *H05K 1/11* | (2006.01) | |

(52) U.S. Cl.
CPC ........... *H01F 27/2804* (2013.01); *H02K 1/12* (2013.01); *H02K 1/182* (2013.01); *H02K 9/22* (2013.01); *H02K 11/26* (2016.01); *H02K 11/30* (2016.01); *H02K 21/24* (2013.01); *H05K 1/0201* (2013.01); *H05K 1/0218* (2013.01); *H05K 1/0298* (2013.01); *H05K 1/115* (2013.01); *H05K 1/165* (2013.01); *H01F 2017/002* (2013.01); *H01F 2017/0053* (2013.01); *H01F 2027/2809* (2013.01); *H02K 2203/03* (2013.01); *H02K 2211/03* (2013.01); *H05K 2201/093* (2013.01); *H05K 2201/095* (2013.01); *H05K 2201/10416* (2013.01)

(58) Field of Classification Search
CPC .... H05K 1/0298; H05K 1/0218; H05K 1/165; H05K 3/429; H02K 11/26; H02K 21/24; H02K 3/26; H02K 9/22; H02K 1/182; H02K 1/12; H02K 11/30; H02K 33/18; H01F 17/0013; H01F 27/2804; H01F 27/22; H01F 27/08; H01F 27/2876; H01F 41/041; G09G 3/2092
See application file for complete search history.

(56) References Cited

U.S. PATENT DOCUMENTS

| | | |
|---|---|---|
| 4,578,608 A | 3/1986 | Mech et al. |
| 4,707,645 A | 11/1987 | Miyao et al. |
| 4,760,294 A | 7/1988 | Hansen |
| 4,982,130 A | 1/1991 | Cap et al. |
| 5,021,698 A | 6/1991 | Pullen et al. |
| 5,099,162 A | 3/1992 | Sawada |
| 5,176,509 A | 1/1993 | Schmider et al. |
| 5,334,899 A | 8/1994 | Skybyk |
| 5,349,276 A | 9/1994 | Mezzatesta et al. |
| 5,392,176 A | 2/1995 | Anderson |
| 5,644,183 A | 1/1997 | Van Loenen et al. |
| 5,666,011 A | 9/1997 | Hong |
| 5,789,841 A | 8/1998 | Wang |
| 5,887,145 A | 3/1999 | Harari et al. |
| 5,969,909 A | 10/1999 | Cheong |
| 5,982,074 A | 11/1999 | Smith et al. |
| 6,005,324 A | 12/1999 | Kim |
| 6,031,738 A | 2/2000 | Lipo et al. |
| 6,348,751 B1 | 2/2002 | Jermakian et al. |
| 6,369,470 B1 | 4/2002 | Kylander et al. |
| 6,411,002 B1 | 6/2002 | Smith et al. |
| 6,664,673 B2 | 12/2003 | Lopatinsky et al. |
| 6,700,252 B2 | 3/2004 | Fleshman et al. |
| 6,707,221 B2 | 3/2004 | Carl |
| 6,713,911 B2 | 3/2004 | Yamaguchi |
| 6,787,965 B1 | 9/2004 | Horng et al. |
| 6,836,039 B2 | 12/2004 | Choi et al. |
| 6,909,215 B2 | 6/2005 | Bryant |
| 6,923,619 B2 | 8/2005 | Fedoseyev et al. |
| 6,998,751 B2 | 2/2006 | Lopatinsky et al. |
| 7,036,205 B2 | 5/2006 | Fukushima et al. |
| 7,081,698 B1 | 7/2006 | Burkholder et al. |
| 7,109,625 B1 | 9/2006 | Jore et al. |
| 7,112,910 B2 | 9/2006 | Lopatinsky et al. |
| 7,165,413 B2 | 1/2007 | Symons |
| 7,282,828 B2 | 10/2007 | Takeuchi |
| 7,291,956 B2 | 11/2007 | Itoh et al. |
| 7,375,449 B2 | 5/2008 | Butterfield |
| 7,402,934 B1 | 7/2008 | Gabrys |
| 7,573,173 B1 | 8/2009 | Frownfelter |
| 7,608,964 B2 | 10/2009 | Yamagiwa |
| 7,663,269 B2 | 2/2010 | Laughlin |
| 7,663,279 B2 | 2/2010 | Tsai et al. |
| 7,741,804 B2 | 6/2010 | Fridhendler et al. |
| 7,800,274 B2 | 9/2010 | Yamaguchi et al. |
| 7,888,834 B2 | 2/2011 | Tsai et al. |
| 8,035,267 B2 | 10/2011 | Suzuki et al. |
| 8,115,361 B2 | 2/2012 | Iki et al. |
| 8,148,870 B2 | 4/2012 | Iki et al. |
| 8,193,678 B2 | 6/2012 | Horng et al. |
| 8,193,781 B2 | 6/2012 | Lin et al. |
| 8,362,751 B2 | 1/2013 | Lin et al. |
| 8,382,450 B2 | 2/2013 | Ida et al. |
| 8,384,261 B2 | 2/2013 | Kinpara et al. |
| 8,536,747 B1 | 9/2013 | Baggett |
| 8,558,425 B2 | 10/2013 | Stahlhut et al. |
| 8,624,463 B2 | 1/2014 | Schmidt |
| 8,736,133 B1 | 5/2014 | Smith et al. |
| 8,785,784 B1 | 7/2014 | Duford et al. |
| 8,823,241 B2 | 9/2014 | Jore et al. |
| 9,154,024 B2 | 10/2015 | Jore et al. |
| 9,240,733 B2 | 1/2016 | Royak et al. |
| 9,287,739 B2 | 3/2016 | Ashe et al. |
| 9,407,117 B2 | 8/2016 | Rimai et al. |
| 9,431,875 B2 | 8/2016 | Keogh et al. |
| 9,509,198 B2 | 11/2016 | Jahshan |
| 9,570,945 B2 | 2/2017 | Fischer |
| 9,583,982 B2 | 2/2017 | Ashe et al. |
| 9,595,857 B2 | 3/2017 | Cawthorne et al. |
| 9,673,684 B2 | 6/2017 | Shaw |
| 9,673,688 B2 | 6/2017 | Shaw |
| 9,762,099 B2 | 9/2017 | Jore et al. |
| 9,800,109 B2 | 10/2017 | Shaw |
| 9,859,763 B2 | 1/2018 | Shaw |
| 10,135,310 B2 | 11/2018 | Schuler et al. |
| 10,141,803 B2 | 11/2018 | Schuler et al. |
| 10,141,804 B2 | 11/2018 | Schuler et al. |
| 10,170,953 B2 | 1/2019 | Shaw |
| 10,186,922 B2 | 1/2019 | Schuler et al. |
| 10,211,694 B1 | 2/2019 | Shaw |
| 10,256,690 B2 | 4/2019 | Shaw |
| 10,263,485 B2 | 4/2019 | Koenen et al. |
| 10,340,760 B2 | 7/2019 | Schuler et al. |
| 10,393,840 B2 | 8/2019 | Feiweier |
| 10,461,612 B2 | 10/2019 | Gloss |
| 10,511,201 B2 | 12/2019 | Kim et al. |
| 10,718,339 B2 | 7/2020 | Patton et al. |
| 10,727,712 B2 | 7/2020 | Schuler et al. |
| 10,748,689 B2 | 8/2020 | Kim et al. |
| 10,778,071 B2 | 9/2020 | Kim et al. |
| 10,804,789 B2 | 10/2020 | Hsu et al. |
| 10,826,418 B2 | 11/2020 | Frampton et al. |
| 10,837,494 B2 | 11/2020 | Den Haak et al. |
| 10,855,129 B1 | 12/2020 | Lenius et al. |
| 10,896,271 B1 | 1/2021 | Baudart et al. |
| 10,910,903 B2 | 2/2021 | Witczak et al. |
| 10,931,175 B2 | 2/2021 | Gassend et al. |
| 2003/0020353 A1 | 1/2003 | Lopatinsky et al. |
| 2003/0042570 A1 | 3/2003 | Hanks |
| 2003/0067234 A1 | 4/2003 | White et al. |
| 2004/0108789 A1 | 6/2004 | Marshall |
| 2004/0245878 A1 | 12/2004 | Kim et al. |
| 2005/0218746 A1 | 10/2005 | Fukasaku et al. |
| 2006/0022543 A1 | 2/2006 | Takeuchi |
| 2006/0055265 A1 | 3/2006 | Zalusky |
| 2006/0202584 A1 | 9/2006 | Jore et al. |

(56) References Cited

U.S. PATENT DOCUMENTS

| | | |
|---|---|---|
| 2007/0048158 A1 | 3/2007 | Kochan |
| 2007/0296369 A1 | 12/2007 | Yeh |
| 2008/0017402 A1 | 1/2008 | Huang et al. |
| 2008/0018187 A1 | 1/2008 | Yamaguchi et al. |
| 2008/0042515 A1 | 2/2008 | Butterfield |
| 2008/0100166 A1 | 5/2008 | Stahlhut et al. |
| 2008/0101966 A1 | 5/2008 | Lopatinsky et al. |
| 2008/0272666 A1 | 11/2008 | Halstead |
| 2008/0278010 A1 | 11/2008 | Ishikawa et al. |
| 2009/0051317 A1 | 2/2009 | Fridhendler et al. |
| 2009/0109624 A1 | 4/2009 | Chan et al. |
| 2009/0140600 A1 | 6/2009 | Tsai et al. |
| 2009/0200890 A1 | 8/2009 | Halstead |
| 2010/0090553 A1 | 4/2010 | Ritchey |
| 2010/0119385 A1 | 5/2010 | Hanaoka et al. |
| 2010/0145401 A1 | 6/2010 | Nishiguchi et al. |
| 2010/0156401 A1 | 6/2010 | Nishiguchi et al. |
| 2010/0253170 A1 | 10/2010 | Bi et al. |
| 2010/0277025 A1 | 11/2010 | Doi et al. |
| 2010/0283252 A1 | 11/2010 | Fradella |
| 2010/0314974 A1 | 12/2010 | Horng et al. |
| 2011/0057536 A1 | 3/2011 | Horng et al. |
| 2011/0140558 A1 | 6/2011 | Kinpara et al. |
| 2011/0253310 A1 | 10/2011 | Benjamin |
| 2011/0273048 A1 | 11/2011 | Jore et al. |
| 2011/0291511 A1 | 12/2011 | Crocker |
| 2012/0001523 A1 | 1/2012 | Lordo |
| 2012/0169154 A1 | 7/2012 | Curodeau |
| 2012/0228972 A1 | 9/2012 | Moya et al. |
| 2012/0235523 A1 | 9/2012 | Moya et al. |
| 2012/0235530 A1 | 9/2012 | Moya et al. |
| 2012/0256422 A1 | 10/2012 | Fradella |
| 2012/0256585 A1 | 10/2012 | Partovi et al. |
| 2013/0049500 A1 | 2/2013 | Shan et al. |
| 2013/0076192 A1 | 2/2013 | Tanimoto |
| 2013/0066194 A1 | 3/2013 | Seter et al. |
| 2013/0069473 A1 | 3/2013 | Miyata et al. |
| 2013/0307356 A1 | 11/2013 | Tanimoto |
| 2013/0307366 A1 | 11/2013 | Naginsky et al. |
| 2014/0042842 A1 | 2/2014 | Tokoi et al. |
| 2014/0175922 A1 | 6/2014 | Jore et al. |
| 2014/0210285 A1 | 7/2014 | Fahimi |
| 2014/0265748 A1 | 9/2014 | Clendenen et al. |
| 2014/0306565 A1 | 10/2014 | James |
| 2014/0319949 A1 | 10/2014 | Langreck |
| 2015/0015102 A1 | 1/2015 | Wong et al. |
| 2015/0048713 A1 | 2/2015 | Caamano et al. |
| 2015/0076929 A1 | 3/2015 | Elenga et al. |
| 2015/0084446 A1 | 3/2015 | Atar |
| 2015/0111752 A1 | 4/2015 | Guina et al. |
| 2015/0214801 A1 | 7/2015 | Libault |
| 2015/0244213 A1 | 8/2015 | Tsai et al. |
| 2015/0262610 A1 | 9/2015 | Lin et al. |
| 2015/0318751 A1 | 11/2015 | Smith et al. |
| 2015/0318772 A1 | 11/2015 | Jahshan |
| 2015/0349609 A1 | 12/2015 | Tremelling et al. |
| 2015/0369216 A1 | 12/2015 | Kisovec |
| 2016/0036308 A1 | 2/2016 | Bailey et al. |
| 2016/0069352 A1 | 3/2016 | Kreidler et al. |
| 2016/0072359 A1 | 3/2016 | Kreidler et al. |
| 2016/0105065 A1 | 4/2016 | Takahashi |
| 2016/0126794 A1 | 5/2016 | Gery et al. |
| 2016/0163445 A1 | 6/2016 | Bertels |
| 2016/0197569 A1 | 7/2016 | Lamprecht |
| 2016/0218577 A1 | 7/2016 | Chen et al. |
| 2016/0233751 A1 | 8/2016 | Theuret |
| 2016/0285323 A1 | 9/2016 | Lin et al. |
| 2016/0301275 A1 | 10/2016 | Head et al. |
| 2016/0315510 A1 | 10/2016 | Kawamata et al. |
| 2016/0322884 A1 | 11/2016 | Perriere |
| 2016/0329796 A1 | 11/2016 | Hano et al. |
| 2016/0336824 A1 | 11/2016 | Duan et al. |
| 2016/0336835 A1 | 11/2016 | Bickers et al. |
| 2016/0336836 A1 | 11/2016 | Bickers et al. |
| 2016/0341202 A1 | 11/2016 | Chai et al. |
| 2017/0047792 A1 | 2/2017 | Klassen et al. |
| 2017/0047793 A1 | 2/2017 | Klassen et al. |
| 2017/0067470 A1 | 3/2017 | Patton et al. |
| 2017/0098973 A1 | 4/2017 | Shaw |
| 2017/0098982 A1 | 4/2017 | Shaw |
| 2017/0155291 A1 | 6/2017 | Deak et al. |
| 2017/0155347 A1 | 6/2017 | Park et al. |
| 2017/0194823 A1 | 7/2017 | Tokoi et al. |
| 2017/0229949 A1 | 8/2017 | Na et al. |
| 2017/0317558 A1* | 11/2017 | Steg .................... H02K 9/223 |
| 2017/0338760 A1 | 11/2017 | Gibbs et al. |
| 2018/0019646 A1 | 1/2018 | Quick et al. |
| 2018/0080573 A1 | 3/2018 | Bourqui |
| 2018/0175691 A1 | 6/2018 | Koenen et al. |
| 2018/0219445 A1 | 8/2018 | Jore et al. |
| 2018/0331632 A1 | 11/2018 | Wang et al. |
| 2018/0351441 A1 | 12/2018 | Milheim |
| 2019/0074746 A1 | 3/2019 | Schuler et al. |
| 2019/0109504 A1 | 4/2019 | Schuler |
| 2019/0393749 A1 | 12/2019 | Park et al. |
| 2020/0067361 A1 | 2/2020 | Shaw et al. |
| 2020/0128671 A1 | 4/2020 | Xiang et al. |
| 2020/0146174 A1 | 5/2020 | Song et al. |
| 2020/0177034 A1 | 6/2020 | Beyerl et al. |
| 2020/0204025 A9 | 6/2020 | Schuler et al. |
| 2020/0220406 A1 | 7/2020 | Schuler et al. |
| 2020/0280233 A1 | 9/2020 | Dehez et al. |
| 2020/0303982 A1 | 9/2020 | Richardson |
| 2020/0313520 A1 | 10/2020 | Quick et al. |
| 2020/0381970 A1 | 12/2020 | Dehez et al. |
| 2020/0389080 A1 | 12/2020 | Haase et al. |
| 2021/0050767 A1 | 2/2021 | Yen et al. |

FOREIGN PATENT DOCUMENTS

| | | |
|---|---|---|
| CN | 101861693 | 10/2010 |
| CN | 203377758 | 1/2014 |
| CN | 103930024 | 7/2014 |
| CN | 105490476 | 4/2016 |
| CN | 105720717 | 6/2016 |
| CN | 105896760 | 8/2016 |
| CN | 106374643 | 2/2017 |
| CN | 107534381 A | 1/2018 |
| CN | 108119539 A | 6/2018 |
| CN | 109072929 A | 12/2018 |
| CN | 110100372 A | 8/2019 |
| CN | 111010008 | 4/2020 |
| CN | 112003405 A | 11/2020 |
| CN | 112292800 A | 1/2021 |
| CN | 109995153 B | 2/2021 |
| CN | 112368913 A | 2/2021 |
| CN | 109219916 B | 3/2021 |
| EP | 2863524 | 4/2015 |
| EP | 3034763 | 6/2016 |
| EP | 3104504 | 12/2016 |
| EP | 3785356 A1 | 3/2020 |
| EP | 2878064 | 11/2020 |
| EP | 3243258 | 11/2020 |
| EP | 3754813 A1 | 12/2020 |
| EP | 3446396 B1 | 2/2021 |
| GB | 1317092 | 5/1973 |
| GB | 2338117 | 12/1999 |
| GB | 2485185 | 5/2012 |
| JP | S6253146 | 3/1987 |
| JP | H06311682 | 11/1994 |
| JP | H0865935 | 3/1996 |
| JP | H10248224 | 9/1998 |
| JP | 2004088969 | 3/2004 |
| JP | 2004088997 | 3/2004 |
| JP | 2004096872 | 3/2004 |
| JP | 2005502291 | 1/2005 |
| JP | 2005521378 | 7/2005 |
| JP | 2006066527 | 3/2006 |
| JP | 2009001917 | 12/2008 |
| JP | 2010130818 | 6/2010 |
| JP | 2010172094 | 8/2010 |
| JP | 2010528581 | 8/2010 |
| JP | 4996712 | 8/2012 |
| JP | 2012161135 | 8/2012 |

(56) References Cited

FOREIGN PATENT DOCUMENTS

| | | |
|---|---|---|
| JP | 2013051880 | 3/2013 |
| JP | 2015136201 | 7/2015 |
| JP | 2021507664 A | 2/2021 |
| WO | 2007114079 | 11/2007 |
| WO | 2014164334 | 10/2014 |
| WO | 2016021852 | 2/2016 |
| WO | 2016034570 | 3/2016 |
| WO | 2016127207 | 8/2016 |
| WO | 2016169332 | 10/2016 |
| WO | 2016185216 | 11/2016 |
| WO | 2016185218 | 11/2016 |
| WO | 2017032501 | 3/2017 |
| WO | 2017088082 | 6/2017 |
| WO | 2018132469 | 7/2018 |
| WO | 2019121037 | 6/2019 |
| WO | 2020092470 A1 | 5/2020 |

OTHER PUBLICATIONS

International Search Report and Written Opinion of the International Searching Authority for PCT Patent Application No. PCT/US18/13154 dated Mar. 16, 2018; 8 pages.

International Search Report and Written Opinion of the International Searching Authority for PCT Patent Application No. PCT/US18/13162 dated Mar. 23, 2018; 7 pages.

International Search Report and Written Opinion of the International Searching Authority for PCT Patent Application No. PCT/US18/13167 dated May 4, 2018; 8 pages.

Office Action for U.S. Appl. No. 15/864,544 dated Apr. 19, 2018; 19 pages.

Office Action for U.S. Appl. No. 15/864,604 dated May 31, 2018; 16 pages.

Office Action for U.S. Appl. No. 15/864,663 dated May 16, 2018; 15 pages.

Office Action for U.S. Appl. No. 15/864,709 dated Apr. 12, 2018; 23 pages.

Japanese Patent Office, Notice of Reasons for Rejection dated Jan. 29, 2020 in Japanese Patent Application No. 2019-538400, 12 pages.

Japanese Patent Office, Notice of Reasons for Rejection dated Feb. 4, 2020 in Japanese Patent Application No. 2019-538321, 16 pages.

The International Searching Authority, Notification of Transmittal of the International Search Report and Written Opinion of the International Searching Authority dated Oct. 23, 2019 in International Application No. PCT/US2019/041114, 11 pages.

China National Intellectual Property Administration, China Office Action in related CN Patent App. No 201880006674.9, dated Mar. 10, 2020, 6 pages.

Japanese Patent Office, Notice of Reasons for Rejection dated Feb. 10, 2020 in Japanese Patent Application No. 2019-544059, 10 pages.

The International Searching Authority, Notification of Transmittal of the International Search Report and Written Opinion of the International Searching Authority dated Feb. 19, 2021 in International Application No. PCT/US2020/059680, 11 pages.

International Searching Authority, Search Report and Written opinion in related PCT/US2019/023828, dated Jun. 14, 2019, 10 pages.

International Search Report and Written Opinion of the International Searching Authority for PCT Patent Application No. PCT/US21/12954 dated Mar. 26, 2021; 11 pages.

\* cited by examiner

AXIAL FIELD ROTARY ENERGY DEVICE WITH PCB STATOR PANEL HAVING THERMALLY CONDUCTIVE LAYER

This application claims priority to and the benefit of U.S. Prov. App. No. 62/933,598, filed Nov. 11, 2019, U.S. Prov. App. No. 62/933,795, filed Nov. 11, 2019, and U.S. Prov. App. No. 62/960,769, filed Jan. 14, 2020, each of which is incorporated herein by reference in its entirety.

TECHNICAL FIELD

The present invention relates in general to an axial field rotary energy device and, in particular, to a system, method and apparatus for motors and generators having one or more printed circuit board (PCB) stators.

BACKGROUND

Some axial field electric machines, such as motors or generators, use printed circuit board (PCB) stator structures. Examples of such devices are described in U.S. Pat. Nos. 10,141,803, 10,135,310, 10,340,760, 10,141,804 and 10,186,922. Although those designs are workable, improvements continue to be of interest.

SUMMARY

Embodiments of an axial field rotary energy device with a PCB stator panel having thermally conductive layers are disclosed. For example, the device can include rotors having an axis of rotation. Each rotor comprises a magnet. The device can further include a stator assembly located axially between the rotors. The stator assembly can include printed circuit board (PCB) panels. Each PCB panel can have layers, and each layer can have conductive coils. The stator assembly can have a thermally conductive layer that extends from an inner diameter portion to an outer diameter portion of the stator assembly.

The foregoing and other objects and advantages of these embodiments will be apparent to those of ordinary skill in the art in view of the following detailed description, taken in conjunction with the appended claims and the accompanying drawings.

BRIEF DESCRIPTION OF THE DRAWINGS

So that the manner in which the features and advantages of the embodiments are attained and can be understood in more detail, a more particular description can be had by reference to the embodiments that are illustrated in the appended drawings. However, the drawings illustrate only some embodiments and are not to be considered limiting in scope since there can be other equally effective embodiments.

It shall be noted that some of the details and/or features shown in the drawings herein may not be drawn to scale for clarity purposes.

The use of the same reference symbols in different drawings indicates similar or identical items.

DETAILED DESCRIPTION

Figure 1:
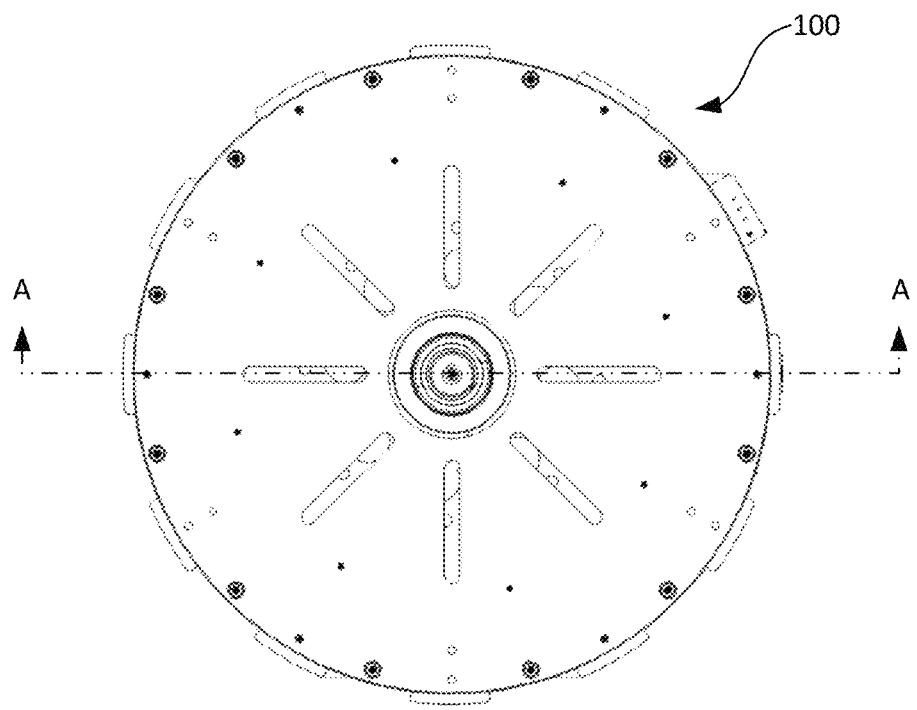
FIG. 1 is a front or axial view of an axial field rotary energy device.
Figure 2:
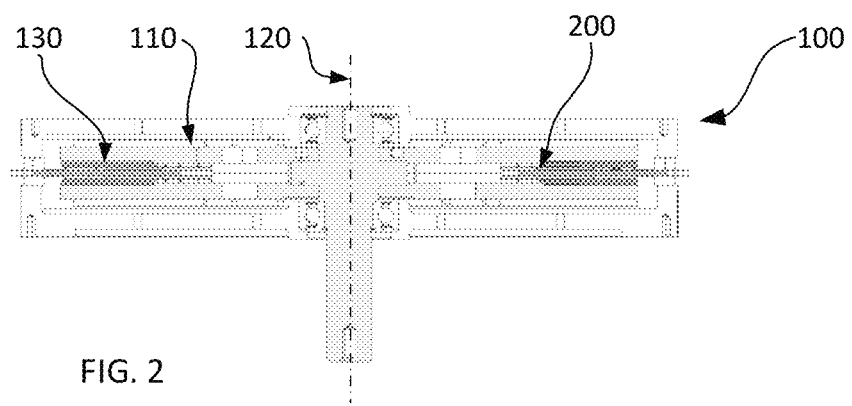
FIG. 2 is a sectional side view of the device in FIG. 1, taken along section line A-A.

Some axial field electric machines can include one or more PCB stators, such as one for each electrical phase of the machine. FIGS. 1 and 2 depict an example of an axial field rotary energy device, such as multiphase device 100. The multiphase device 100 can include at least one rotor 110 with an axis 120 of rotation. Each rotor can comprise at least one magnet 130. The multiphase device 100 also can include at least one PCB stator 200.

Figure 3A:
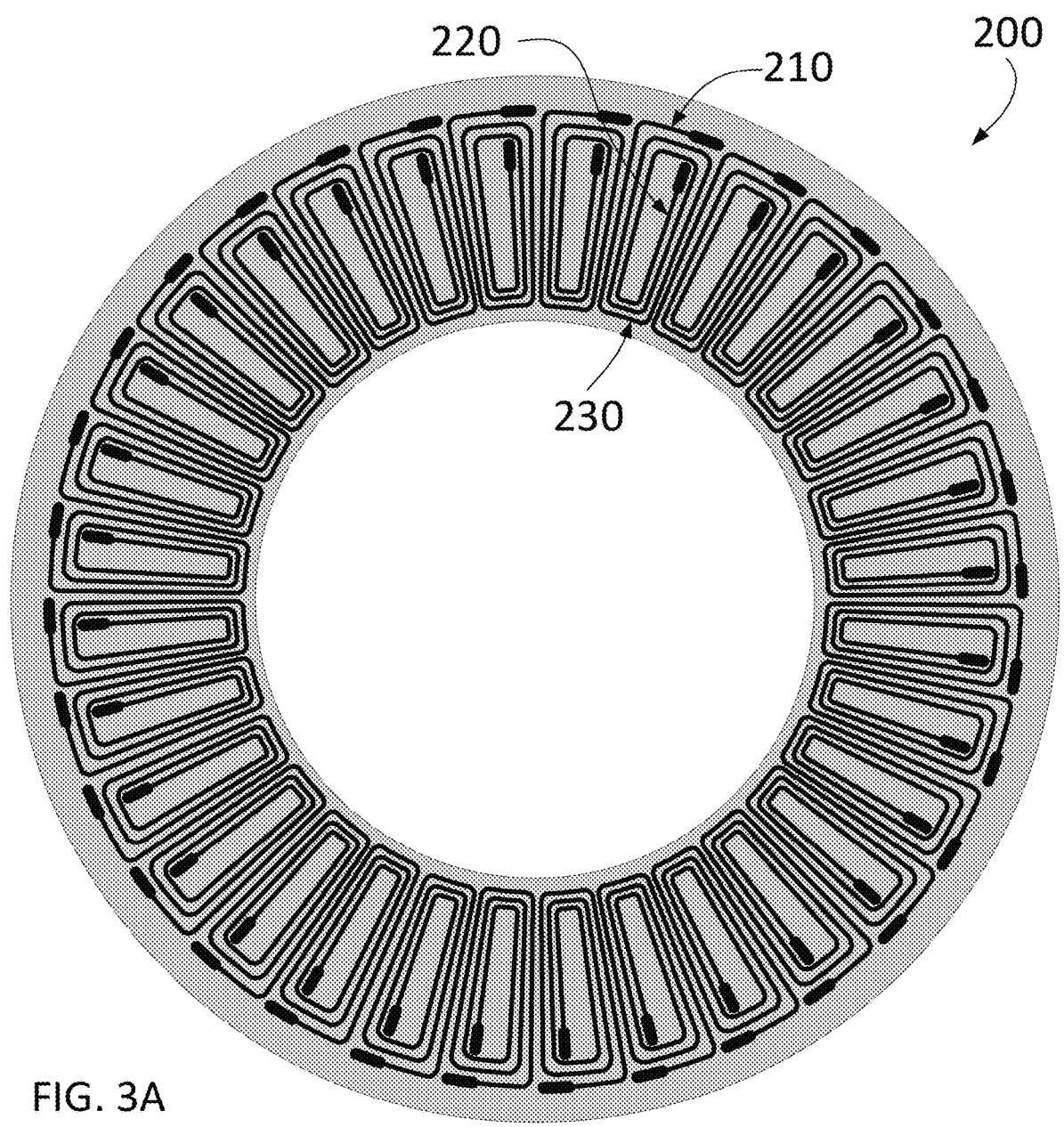
FIG. 3A is a front or axial view of a PCB stator.

As shown in FIG. 3A, each PCB stator 200 can include a plurality of coils 210 formed, for example, in the copper laminated structure of the PCB. The coils 210 can include multiple turns depending on the design of the stator. The coils 210 in the PCB stator 200 can be interconnected with traces (not shown in FIG. 3A) located in the PCB copper laminate structure to form north and south magnetic poles. Although FIG. 3a shows an example of a 32-pole stator, many other pole configurations are possible.

In FIG. 3A, the circular disk example of PCB stator 200 depicts each coil with 3 turns. Each turn can include, for example, two straight sections 220 of conductors that are substantially radially oriented with respect to the axis 120 (FIG. 2). The straight sections 220 can be connected by arches or arch segments 230, which can extend circumferentially relative to the axis 120.

Figure 3B:
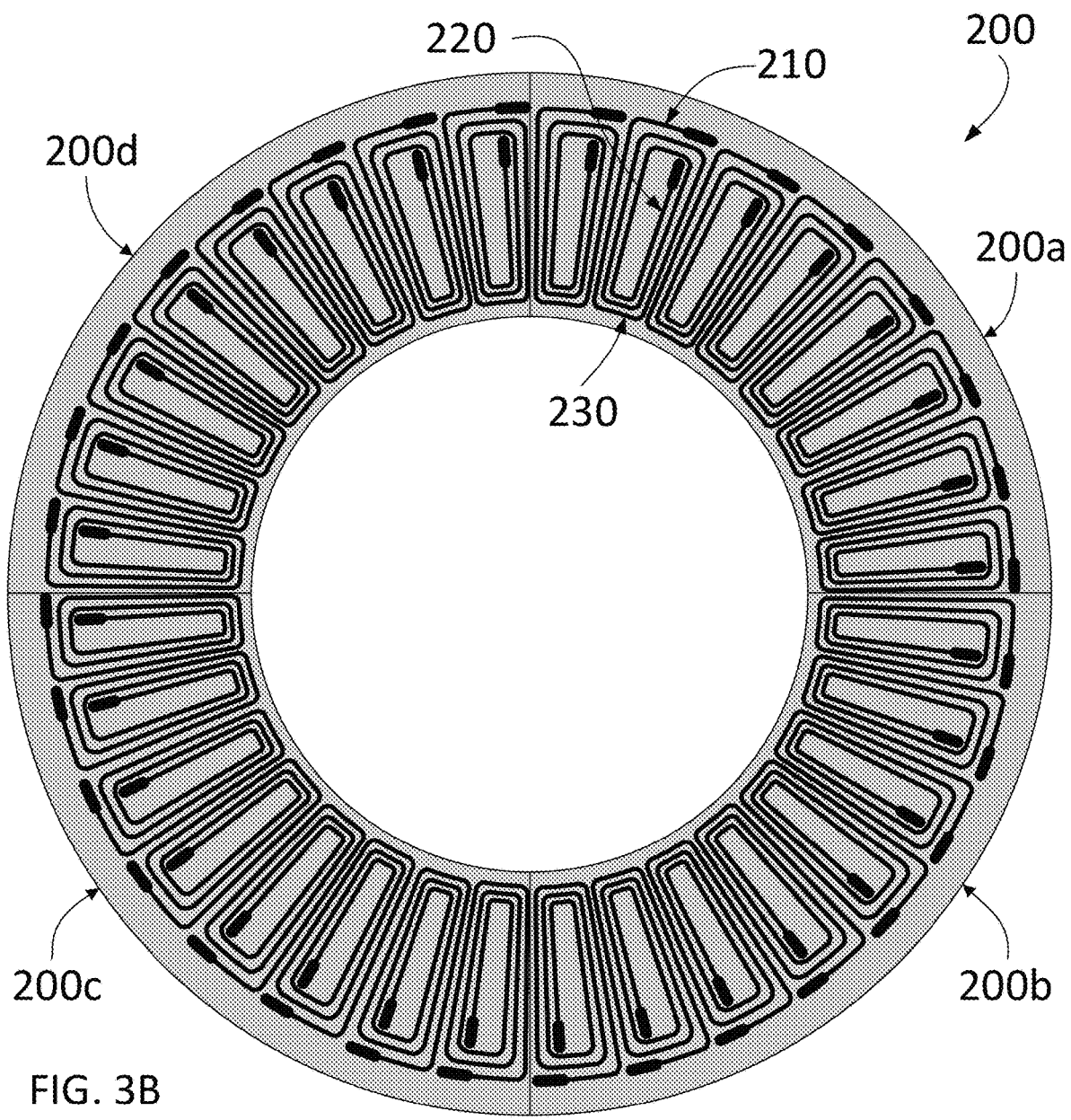
FIG. 3B is a front or axial view of a segmented PCB stator.

In alternate embodiments, the PCB stator 200 can be segmented into separate PCB pieces or components that are coupled together to form a single stator. FIG. 3B depicts an example of the PCB stator 200 with four annular PCB segments 200A, 200B, 200C and 200d, each of which has its own set of coils 210. Although FIG. 3b has a four-segment PCB stator 200, other embodiments can have a different number of segments such as two, three, six, etc.

Figure 4:
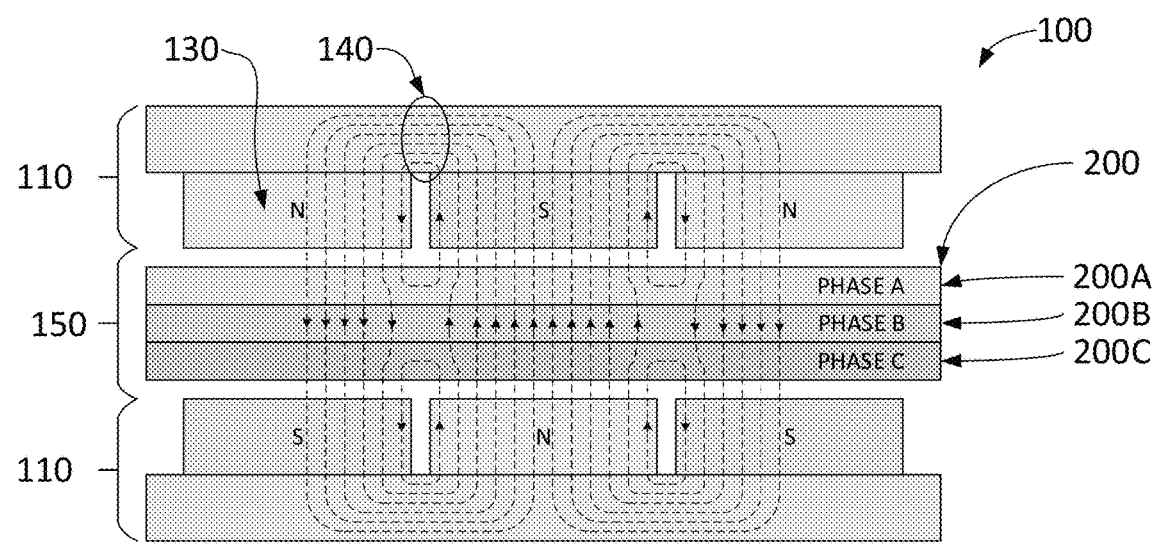
FIG. 4 is a schematic sectional side view of a device with two magnetic rotors and a 3-phase PCB stator with magnetic flux lines crossing between the rotors through the PCB stator.

In the multiphase device 100, the voltages induced in each phase may not be symmetrical due to non-uniform flux distribution across the PCB stator 200. FIG. 4 shows an example of a multiphase device 100 comprising two rotors 110. Each rotor 110 can have a plurality of magnets 130 arranged to produce a magnetic flux 140 across an air gap 150 between the rotors 110. In this version, the PCB stator 200 has three PCB panels 200a, 200b and 200c, each having coils for a different electrical phase. The voltage induced in the phase carried by panel 200b can be lower than the voltages induced in phases carried by panels 200a and 200c, since there are fewer magnetic flux lines linked with the panel 200b.

Figure 5:
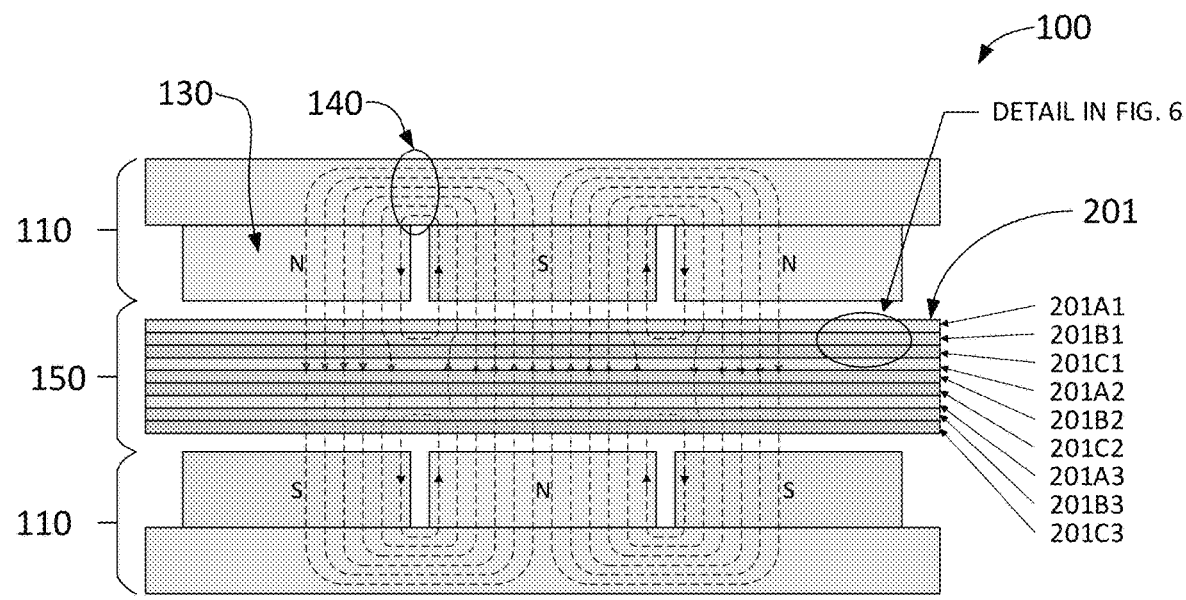
FIG. 5 is a schematic sectional side view of an embodiment of an axial field rotary device having two magnetic rotors and a 3-phase interleaved PCB stator depicting magnetic flux lines crossing between the rotors and through the PCB stator.

FIG. 5 depicts an embodiment of the device 100 where each electrical phase of the PCB stator 201 can be distributed in a plurality of interleaved PCB stators. In the example of FIG. 5, a three-phase PCB stator 201 is shown. The structures for each of the three phases can be divided amongst three PCB panels each, in one embodiment. In this version, there is a total of nine PCB panels, including: panels 201a1, 201a2 and 201a3 for phase A, panels 201b1, 201b2 and 201b3 for phase B, and panels 201c1, 201c2 and 201c3 for phase C. The stator panels for each phase can be interleaved in, for example, a repeating pattern to form three sets of three-panel stators, where each panel in a set is assigned to one of the three phases. In this example, panels 201A1, 201B1 and 201C1 are for Set 1, panels 201A2, 201B2 and 201C2 are for Set 2, and panels 201A3, 201B3 and 201C3 are for Set 3. The flux linked with each stator can vary across the stator structure, in this embodiment. The average flux linkage in each phase, however, can be more uniform than the example depicted in FIG. 4. As a result, the induced voltage per phase can be more balanced in FIG. 5.

Figure 6:
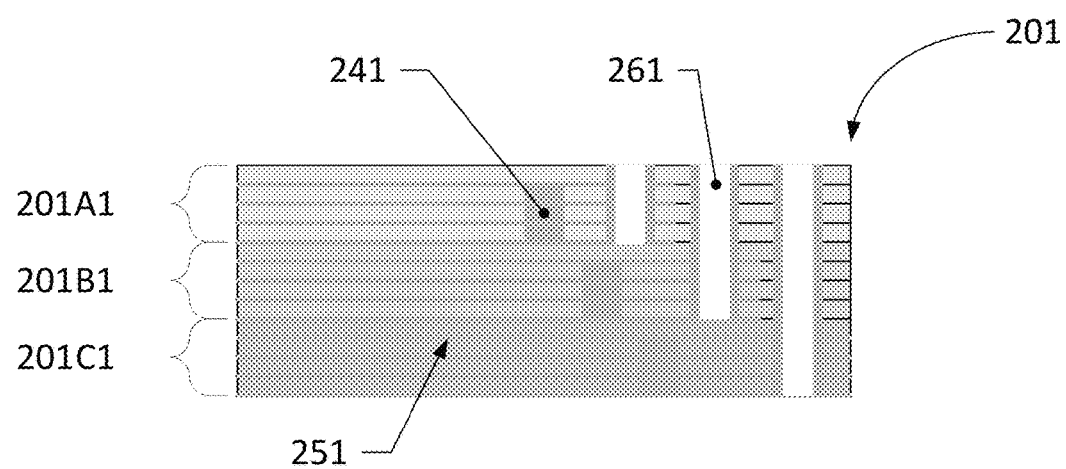
FIG. 6 is an enlarged, partial, sectional side view of an embodiment of the PCB stator of FIG. 5.

FIG. 6 shows details of panels of the PCB stator 201 depicted in FIG. 5. Each PCB panel 201A1, 201B1 and 201C1 can have multiple layers. In the example shown in FIG. 6, each stator panel has four layers 251. Each layer 251 can have a plurality of coils. The layers 251 can be interconnected with buried vias 241. The layers 251 can be connected to other panels, to a power supply outside the device 100 or other components with vias 261. Although FIGS. 5 and 6 show an example of a three-phase PCB stator with nine interleaved stator panels and each panel comprising four layers, other embodiments are possible including devices with different numbers of phases, different numbers of PCB panels, and different numbers of layers. The number of layers in each panel can be the same or different. In some embodiments, the total number of layers per phase can be adjusted to balance the voltage induced in each phase.

Figure 7A:
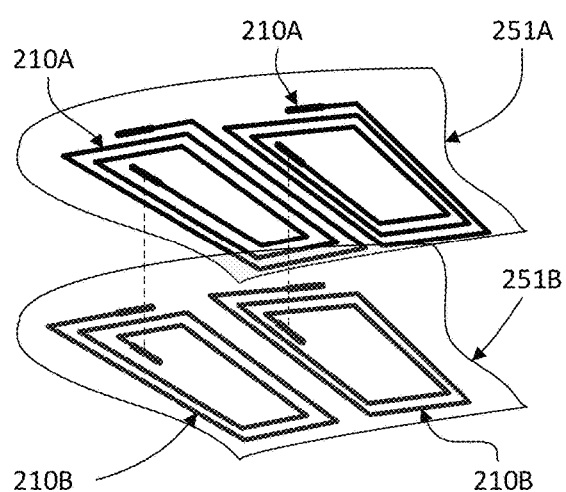
FIG. 7A is a schematic diagram of an embodiment of layers of a PCB stator depicting coils with different numbers of turns in different layers.

FIG. 7A illustrate an example of an embodiment where the panel can have a first layer 251A where coils 210A can have a first number of turns (e.g., 3 turns), and a second layer 251B where coils 210B can have second number of turns different from the first number of turns (e.g., 2 turns). Thus, the total number of turns per phase can be adjusted to, for example, balance the voltage induced in each phase. Other embodiments can have different combinations of turns per coil.

Figure 7B:
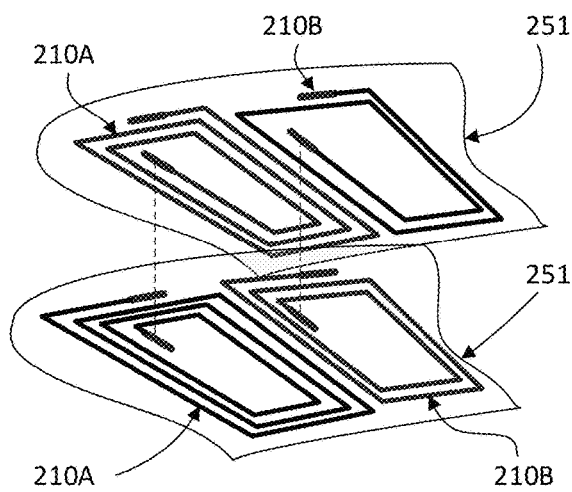
FIG. 7B is a schematic diagram of an embodiment of layers of a PCB stator depicting coils with different number of turns in the same layer.

Moreover, some embodiments as the one shown in FIG. 7B can have layers 251 where a first set of coils 210A have a first number of turns (e.g., 3 turns) and a second set of coils 210B have a second number of turns different from the first number of turns (e.g., 2 turns), so the total number of turns per phase can be further adjusted to balance the voltage induced in each phase. The coil pattern shown in FIG. 7B can repeat throughout the layer.

Other embodiments can have different patterns of coils and turns per coils (e.g., one coil with 4 turns and one coil with 5 turns, or two coils with 4 turns and one coil with 3 turns).

Furthermore, some embodiments can have PCB panels with first and second layers. The first layer can have a first set of coils with a first number of turns (e.g., 3 turns), and a second set of coils with a second number of turns (e.g., 2 turns). Versions of the second layer can have a third set of coils with a third number of turns (e.g., 4 turns), and a fourth set of coils with a fourth number of turns (e.g., 5 turns). In some examples, the first, second, third and fourth number of turns can be all different, all the same, of any permutation of values.

It should be understood that the embodiments described herein and depicted in the drawings can be applicable to both PCB stators having a single, integral, monolithic stator structure and to those having a segmented stator structure that is coupled together to form the PCB stator.

Figure 8:
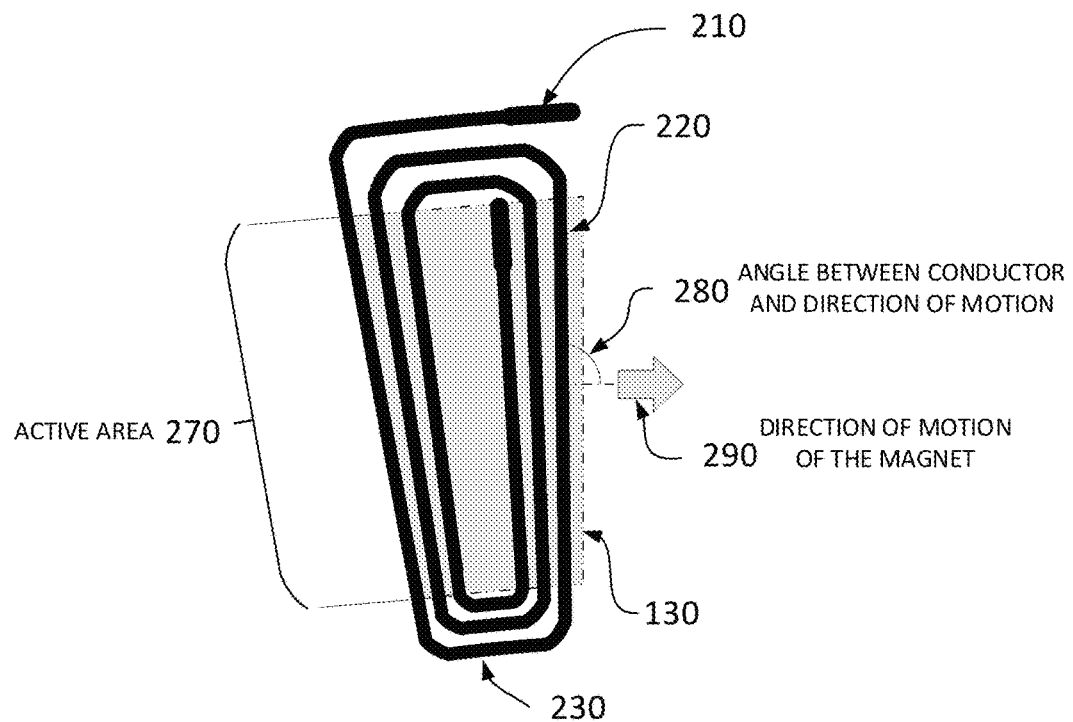
FIG. 8 is a schematic view of a single coil of a PCB stator relative to the magnetic field active area produced by the rotor magnet.

FIG. 8 shows a typical coil 210 formed on a PCB stator. Coil 210 can include multiple turns depending on the design of the PCB stator. FIG. 8 depicts an example of a 3-turn coil in the PCB stator. Each turn can include two straight sections 220 of conductors that are substantially radially oriented with respect to the axis of the circular disk PCB. The straight sections 220 are connected by arches or arch segments 230 that are circumferential relative to the axis.

A lesser desired effect of the interaction between the magnetic field established by magnets 130 and the stator conductors can include the generation of eddy currents in the straight sections 220. Eddy currents are undesirable since they do not produce useful torque. In addition, they can generate losses that can produce heat and they can reduce the efficiency of the machine. Eddy currents are affected, among other factors, by the length of the conductor immersed in the magnetic field, as well as its angle relative to the direction of the relative motion between the coil and the magnetic field. In the example of FIG. 8, the angle 280 between the straight sections 220 and the tangential direction of motion 290 of the magnetic field is approximately 90 degrees. The eddy current on a conductor can be proportional to the length of the straight sections 220, and to the sine of the angle 280 between the straight sections 220 and the direction of motion 290 of the magnetic field. The largest eddy currents can occur when the angle 280 is 90 degrees.

Figure 9:
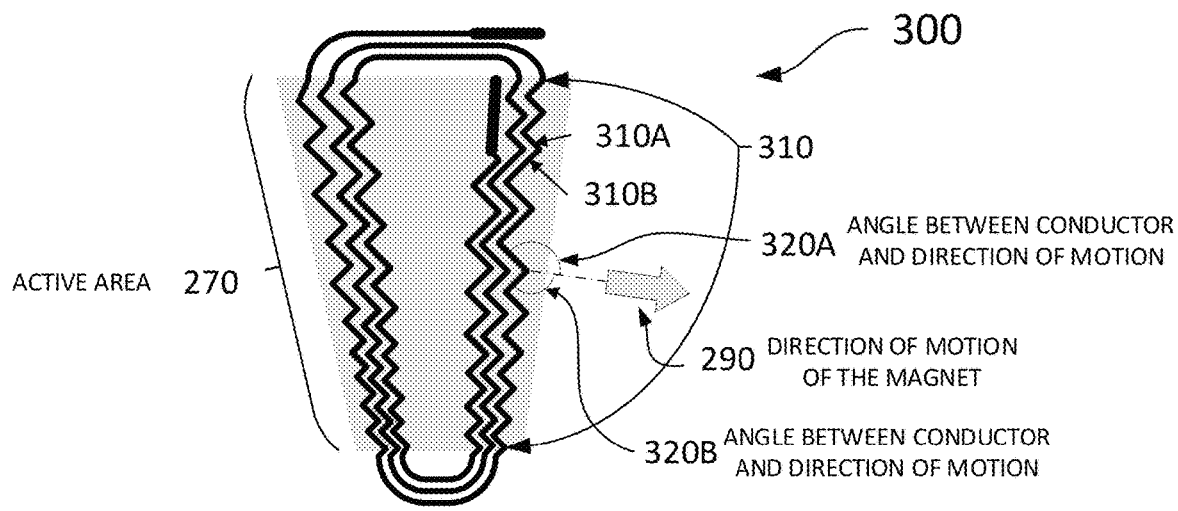
FIG. 9 is a schematic view of an embodiment of a single coil of a PCB stator relative to the magnetic field active area produced by the rotor magnet, showing the coil conductors in a serrated pattern.

FIG. 9 shows an alternate stator coil structure 300 where the typically straight radial conductors 220 (compare FIG. 8) in the active area 270 of the magnetic field are configured as shorter conductor segments extending in different (e.g., alternating) directions. In the version of FIG. 9, the conductors can be formed in a serrated pattern 310. The serrated pattern can include linear or non-linear (e.g., arcuate) segments coupled together. The 'radial' conductors no longer provide a straight path for eddy currents. Instead, the radial portions of the conductors are configured in shorter conductor segments 310A and 310B. The absolute value of angles 320A and 320B relative to the direction of motion 290 of the magnets can be greater than 90 degrees, in some embodiments. This architecture can reduce eddy current losses in the system. In this example, the combined absolute value of angles 320A and 320B is about 135 degrees. However, other angles greater than 90 degrees can be selected.

Figure 10:
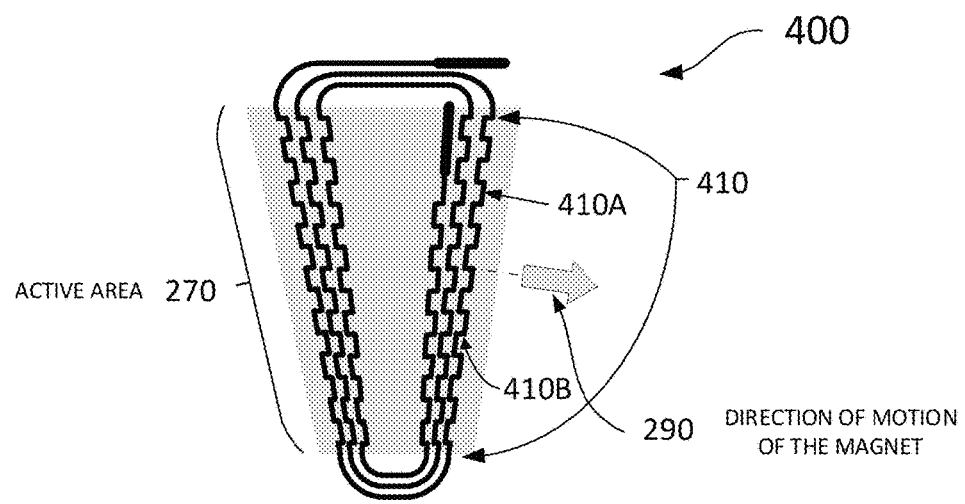
FIG. 10 is a schematic view of another embodiment of a single coil of a PCB stator relative to the magnetic field active area produced by the rotor magnet, showing the coil conductors in a square wave pattern.

FIG. 10 shows an alternate embodiment of a non-linear coil structure 400 where the typically straight radial conductors 220 (compare FIG. 8) are configured as conductors 410 with a generally 'square wave' pattern. This version can include a plurality of shorter conductor segments 410A that can be substantially parallel to each other and can be substantially perpendicular to the direction of motion 290 of the magnets. Alternate segments can be offset laterally from each other, as shown. Adjacent segments can be connected by a conductor segment 410B that can be oriented in a substantially circumferential or tangential direction (e.g., for circular disk embodiments), or in the same general direction of motion 290 of the magnets to form generally 'square wave' patterns. In these embodiments, the 'square wave' pattern can reduce eddy current losses in the system.

Other embodiments can include conductors arranged in other configurations. For example, versions of the conductors can be in a sinusoidal or 'sine wave' pattern along a general radial direction. Still other patterns can include a 'trapezoidal wave' pattern, another pattern or a combination of the patterns described herein. The coils can have multiple layers connected by blind or buried vias. Coils can be distributed over any number of layers and connected in parallel, series or combinations thereof.

As the device 100, shown in FIGS. 1 and 2, is powered, electrical currents circulate through the coils 210 in the stator 200 (refer to FIG. 3A). The circulation of currents produces resistive losses, and the interaction between the currents, external magnetic fields and the magnetic fields produced by the currents themselves produce eddy current losses. The combination of the resistive and eddy currents losses generate heat in the PCB stator 200. This is an undesired effect of the circulation of currents in the PCB stator 200 since it increases the temperature of the stator 200. In extreme cases, the temperature rise of the PCB stator 200 may exceed the temperature class of the laminate used in the PCB stator 200 leading to its premature failure. Accordingly, it is desirable to remove heat from the PCB stator 200 to keep its temperature below the temperature class of the PCB laminate material.

Figure 11:
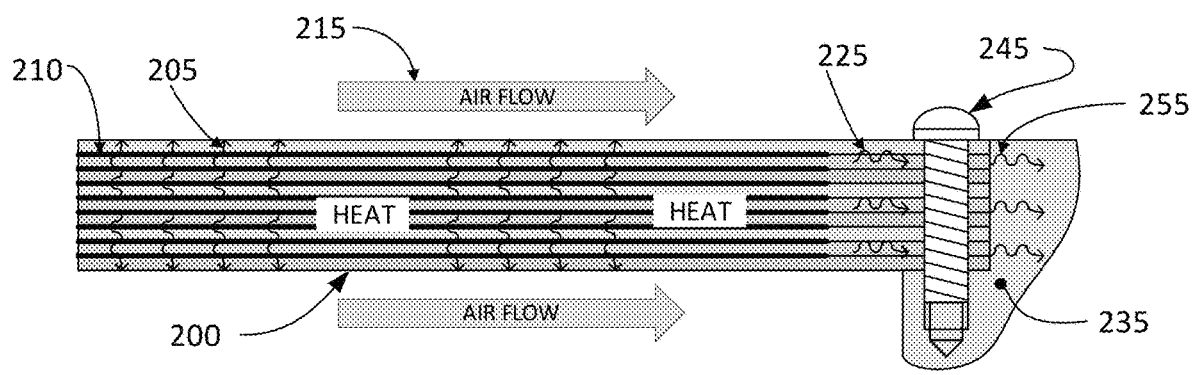
FIG. 11 is a schematic sectional side view of a portion of a PCB stator mounted to a machine housing, showing a heat flow scheme.

The mechanisms for removing heat from the PCB stator 200 can include conduction, convection, and radiation heat transfer. FIG. 11 shows some of the heat removal mechanisms in the PCB stator 200. Some of the heat generated in the conductors of the coils 210 is carried by conduction 205 to the external surfaces of the PCB stator 200 where it can be removed by an air flow 215 provided by a fan or blower. Other portions of the heat generated by the coils 210 can be carried by conduction 225 along the layers of the PCB stator 200 toward the area where the PCB stator 200 is coupled to the machine housing 235 by means of fasteners 245. The fasteners 245 can be screws, clamps, pins, etc., or combinations thereof. Heat 255 can continue to be conducted through the machine housing 235 towards cooler surfaces and volumes as illustrated in FIG. 11.

These heat removal mechanisms can be hindered by the generally poor thermal conductivity of the PCB laminate material. For example, the thermal conductivity is typically about 0.3 W/mK perpendicular to the PCB plane, and about 0.9 W/mK in the PCB plane. If the surface temperature of the PCB is greater than the surrounding surfaces, some of the heat generated in the PCB can be radiated to the surrounding surfaces. The net radiation heat transfer can be expressed by the following Stefan-Boltzmann Law $q=\varepsilon\sigma(T_h^4-T_c^4)A$, where q is the heat transfer, $\varepsilon$ is the emissivity coefficient of the PCB, $\sigma$ is the Stefan-Boltzmann constant, $T_h$ is temperature of the PCB, $T_c$ is the temperature of the surrounding surfaces, and A is the area of the PCB. Although existing heat transfer designs are workable, improvements continue to be of interest.

The embodiments disclosed herein can incorporate one or more thermally conductive layers and features to the PCB. Such features can enhance the heat removal process and lower the overall temperature rise of the PCB. The addition of a layer of thermally conductive material (e.g., copper, anisotropic graphite or graphene, or combinations thereof) to one side or both sides of the PCB, can form a low heat resistance path to facilitate conductive heat flow from the PCB to the machine housing. In addition, the conductive layer(s) can act as a heat spreader to increase convection cooling of the PCB.

The embodiments described herein refer to 'thermally conductive layers' and to 'electrically conductive layers'. Versions of the thermal conductive layer can merely conduct heat and are not connected to an electrical voltage or current source. Examples of electrically conductive layers can be provided to conduct electric current via traces or coils that can be coupled to a voltage or current source.

Figure 12:
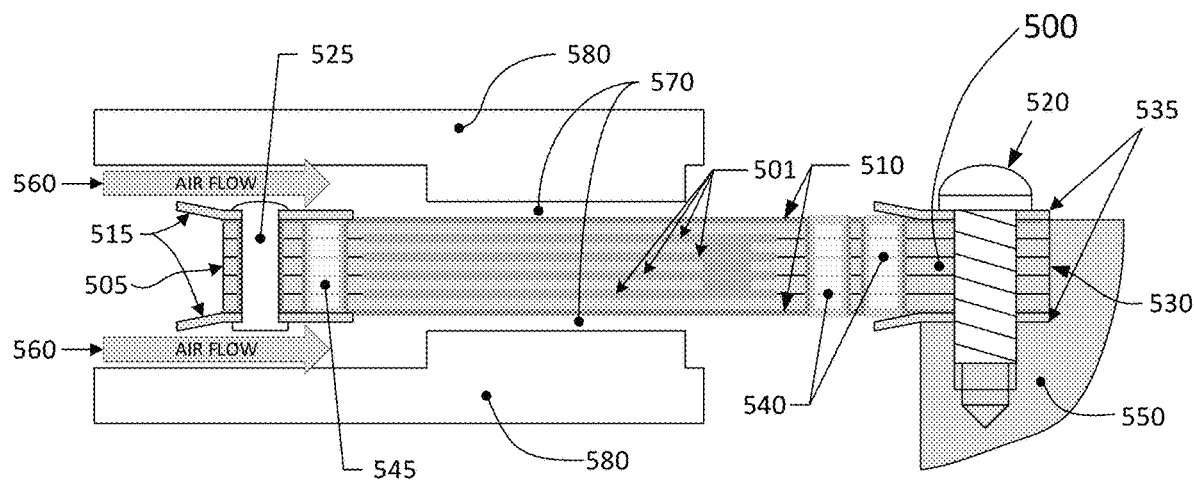
FIG. 12 is a schematic sectional side view of an embodiment of a PCB stator showing thermally conductive layers and other heat removal features included with the device.

FIG. 12 shows a cross-section of an embodiment of a PCB stator 500 with four electrically conductive layers 501. Each layer 501 can have a plurality of coils. In some versions, a layer of a thermally conductive material 510 can be included on both large surfaces of the PCB stator 500. The PCB stator 500 can have an inner diameter edge 505 and an outer diameter edge 530. The outer diameter edge 530 is typically the portion that engages the machine housing 550 when the PCB stator 500 is mounted in the machine housing 550. The external thermally conductive layers 510 can extend from the portion at or near the outer diameter edge 530 to the portion at or near the inner diameter edge 505 of the PCB stator 500.

In some embodiments, vias 540 can be added to the portion near the outer edge 530 of the PCB stator 500. Vias 540 can thermally connect the external thermally conductive layers 530, thereby facilitating heat flow between the two surfaces of the PCB stator 500. Although FIG. 12 shows vias 540 located at two radial locations, it should be understood that other embodiments may not have any vias or may have vias 540 at only one radial location, or at more than two radial locations connecting the external thermally conductive layers 510.

In some embodiments, alternative or additional vias 545 can be added to the portion near the inner edge 505 of the PCB stator 500. Vias 545 also can facilitate heat flow between the two thermally conductive layers 510 on the surfaces of the PCB stator 500. Although FIG. 11 shows vias 545 located at one radial location, it should be understood that other embodiments may not have any vias 545 or may have vias 545 located in two or more radial locations connecting the external thermally conductive layers 510.

In some embodiments, heat sinks formed from thermally conductive materials (e.g., copper alloys, aluminum alloys, etc.) can be included with the PCB stator 500 to facilitate heat removal by convection. FIG. 12 shows a version of heat sinks 515 that are attached, for example, with fasteners 525 to both large sides of the PCB stator 500. The heat sinks 515 can contact the thermally conductive layers 510 adjacent the inner diameter edge 505 of the PCB stator 500. The fasteners 525 can be rivets, bolts and nuts, etc. The heatsinks 515 also can be soldered to the thermally conductive layers 510. The heatsinks 515 can facilitate heat removal by the airflow 560 in the air gap 570 between the PCB stator 500 and the rotors 580.

FIG. 12 also depicts alternative or additional heat sinks 535 coupled to both large sides of the PCB stator 500 near the outer diameter edge 530. The heat sinks 535 can contact the thermally conductive layers 510. Version of the heat sinks 535 can be coupled to the PCB stator 500 with fasteners 520, such as those described herein. In other embodiments, the heat sinks 535 can be coupled to the PCB stator 500 with dedicated fasteners or with solder. Although FIG. 12 shows an embodiment with heat sinks adjacent both edges of the PCB stator, it should be understood that some embodiments may have heat sinks mounted only adjacent the inner edge or only adjacent the outer edge of the PCB stator.

Figure 13:
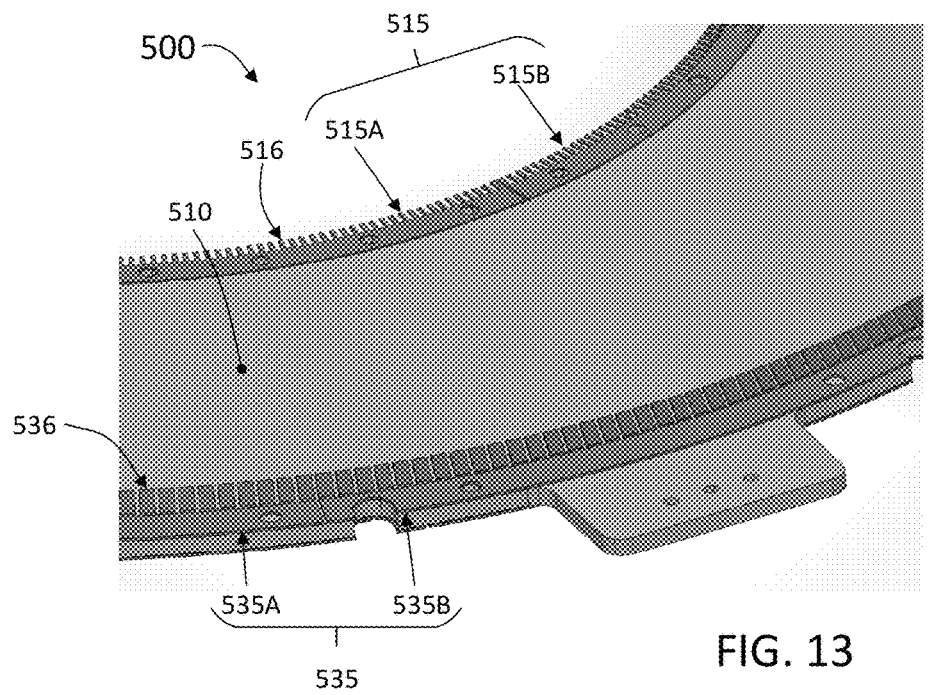
FIG. 13 is a partial perspective view of the embodiment of FIG. 12.

Embodiments of the heatsinks 515 and 535 can be formed from a continuous strip of thermally conductive material or can be segmented. FIG. 13 shows the PCB stator 500 with heat sinks mounted to one of its external thermally conductive layers 510. The heat sink 515 mounted adjacent the inner diameter edge of the PCB stator 500 can include at least two segments 515A and 515B. The heat sink 535 mounted adjacent the outer diameter edge of the PCB stator 500 can include at least two segments 535A and 535B. Other embodiments can have heat sinks with more than two segments.

Heat sinks can have profiles intended to enhance the heat transfer to the cooling air. The heatsinks 515 and 535 shown in FIG. 13 can include rectangular fingers 516 and 536, respectively. Other embodiments can have heat sinks with fingers with different shapes, such as trapezoidal, rhomboidal fingers, etc. The heatsink 515 shown in FIG. 13 can be substantially flat. In contrast, the heat sink 535 has fingers 536 that oriented out of plane relative to the body of the heat sink 535. Other embodiments can include different configurations of heat sinks and/or fingers. As an example, a heat sink may have some of its fingers in-plane and other fingers out of plane. Still other heat sinks may have some of the fingers at a first angle (e.g., 15 degrees) relative to the plane of the heat sink body, and other fingers oriented at a second angle (e.g., 30 degrees), relative to the plane of the heat sink body. Alternative angles, shapes and combinations are possible.

Figure 14:
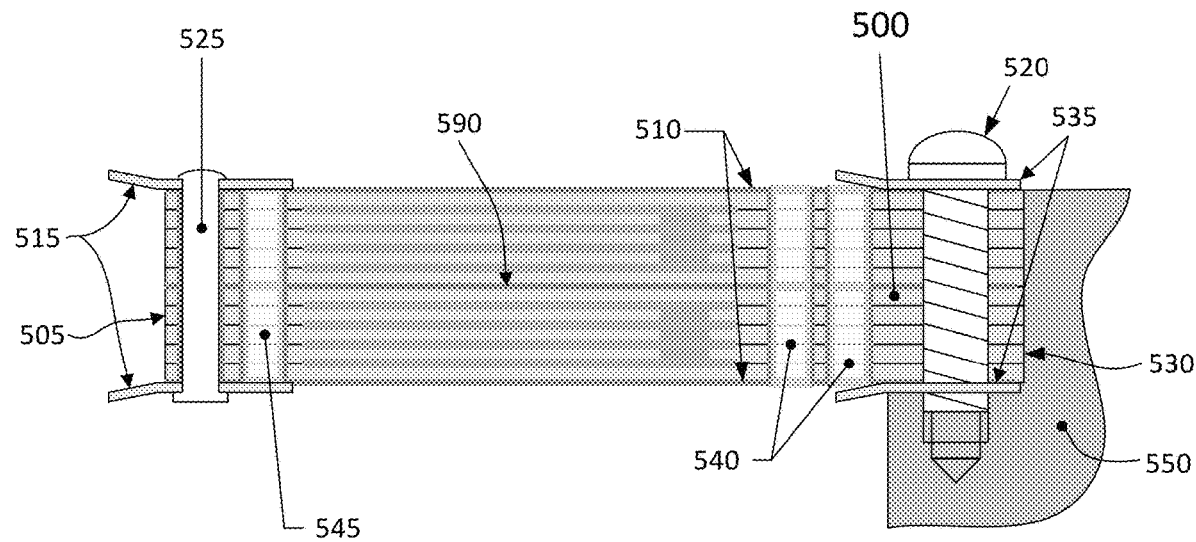
FIG. 14 is a schematic sectional view of an alternate embodiment of a device showing external and internal thermally conductive layers and other heat removal features included with the device.

The use of thermally conductive layers is not limited to the external portions of the PCB stator. For example, FIG. 14 shows an embodiment where an internal thermally conductive layer 590 is included in the PCB stator 500. In this embodiment, the internal thermally conductive layer 590 can extend from or adjacent the outer diameter edge 530 to or adjacent the inner diameter edge 505 of the PCB stator 500. It can be thermally connected to the external thermally conductive layers 510 with vias 540, 545, which are described herein.

Similar to the example shown in FIG. 12, the embodiment depicted in FIG. 14 also includes heat sinks 515 and 535 coupled to the external thermally conductive layers 510 with fasteners 525 and 520, respectively. Other embodiments may not have heatsinks or may have heatsinks in only one edge of the PCB stator 500. Although the embodiment shown in FIG. 14 has one internal thermally conductive layer located approximately halfway between the two external surfaces of the PCB stator, it should be understood that other embodiments may have more internal thermally conductive layers in different structures and locations.

Figure 15A:
FIG. 15A is a schematic sectional side view of an alternate embodiment of a device with multiple external and internal thermally conductive layers.
Figure 15B:
FIG. 15B is a schematic sectional side view of another alternate embodiment of a device with multiple external and internal thermally conductive layers.

FIGS. 15A and 15B illustrate PCB stators 500 with electrically conductive layers 501, external thermally conductive layers 510, and internal thermally conductive layers 590. FIG. 15A is an example of a PCB stator structure 500 with two evenly spaced internal thermally conductive layers 590 spaced apart from each other by four electrically conductive layers 501, and also respectively spaced apart by four electrically conductive layers 501 from the external thermally conductive layers 510. FIG. 15B is an example of a PCB stator structure 500 with three unevenly spaced, internal thermally conductive layers 590. The internal thermally conductive layers 590 are spaced apart from each other by two electrically conductive layers 501, and also respectively spaced apart by four electrically conductive layers 501 from the external thermally conductive layers 510.

Other arrangements of thermally and electrically conductive layers can be used. Moreover, whereas some embodiments with multiple internal thermally conductive layers can include thermally connecting vias 540 and 545 and heat sinks 515 and 545, other embodiments can include only thermally connecting vias. All of these embodiments are applicable to both monolithic PCB stators and those with a segmented structure coupled together to form the PCB stator.

Adding a thermally conductive layer 510 to the exterior of the PCB stator 500 can lower the emissivity of the PCB, thereby reducing the radiation heat transfer from the PCB. The emissivity of the heat conduction layer(s) can be increased through, for example, heat and/or chemical oxidation of the copper traces, and/or by adding a thin solder mask over the traces. By raising the emissivity, the radiation heat transfer from the PCB can be increased. Further, by increasing the emissivity of the surfaces surrounding the PCB, the radiation heat transfer from the PCB can be increased.

As thermally conductive materials tend to be good electrical conductors, and the thermally conductive layers are exposed to varying magnetic fields that can induce unwanted eddy currents, it is desirable to provide these layers with features that limit the circulation of eddy currents.

Figure 16:
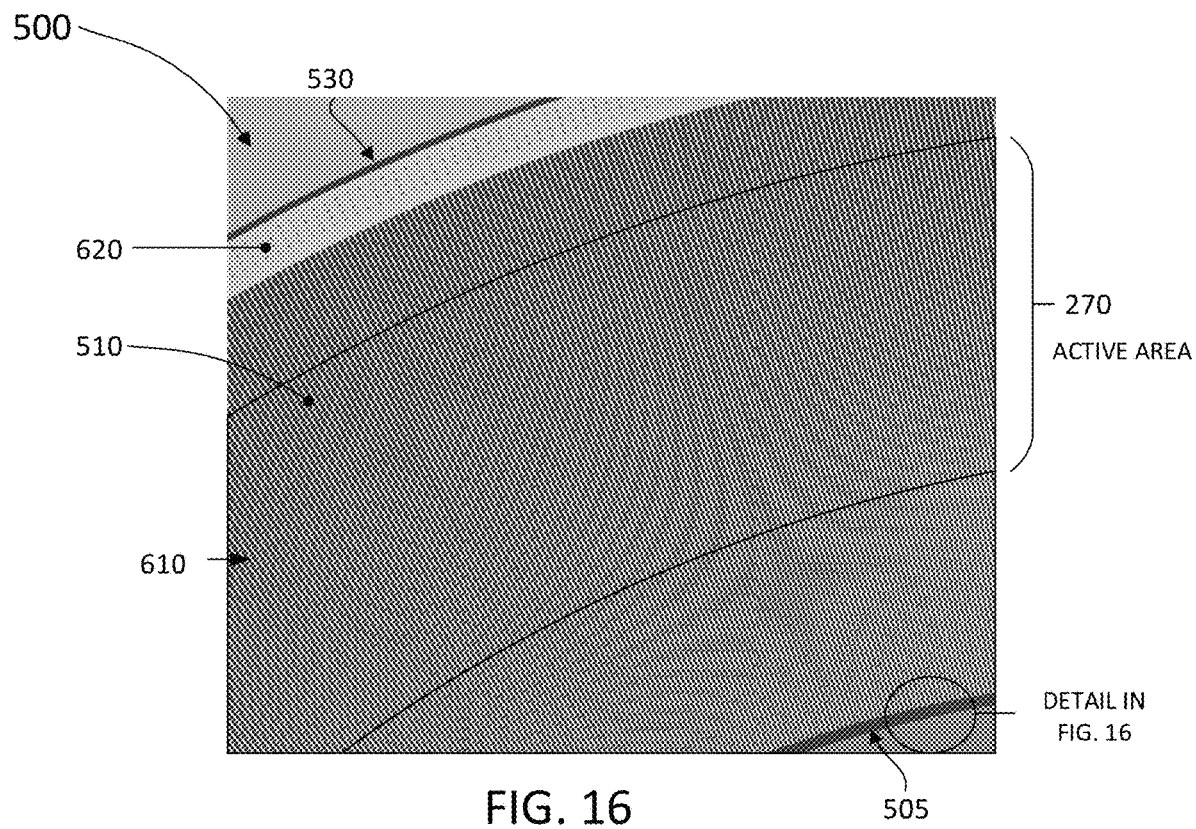
FIG. 16 is a partial axial view of an embodiment of a PCB stator with a thermally conductive layer having substantially straight traces oriented radially relative to the PCB stator.

FIG. 16 depicts an embodiment with a thermally conductive layer 510. The thermally conductive layer 510 can include one or more substantially straight, radial, thermally conductive traces 610 extending from or adjacent the inner diameter edge 505 to or adjacent an outer diameter edge 530 of the PCB stator 500. FIG. 16 shows the approximate location of the portion of the PCB that is subject to magnetic field variation. This also is referred to as the active area 270 of the PCB stator 500. In active area 270, the traces 610 can be substantially thin to reduce eddy current losses in the thermally conductive layer. The trace width in the circumferential or tangential direction can vary, for example, from about 0.005 inches to about 0.040 inches in some embodiments. Other sizes also can be used. The thickness of the traces 610 in the axial direction can vary depending of the availability of PCB laminates. For example, the traces 610 can comprise copper at 1, 2 or 3 ounces per square foot, or other thicknesses. The traces 610 can include the desired PCB thermal characteristics.

In some versions, the traces 610 can merge to a continuous or substantially continuous portion or area 620 of thermally conductive material at or adjacent the outer diameter edge 530. Area 620 can include one or more vias to connect the thermally conductive layers in the PCB. As described herein, some embodiments may not have vias. The area 620 of thermally conductive material also may include through holes to facilitate mounting the PCB stator to the machine housing.

Figure 17:
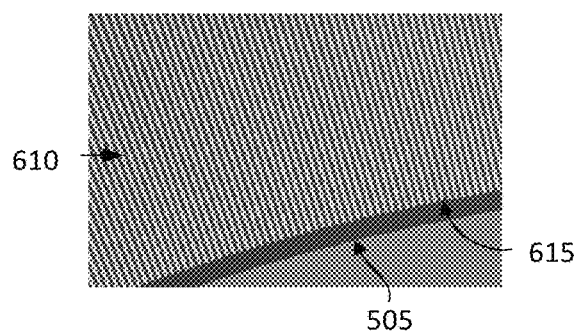
FIG. 17 is an enlarged view of a portion of the embodiment of FIG. 16.

Examples of the thermally conductive traces 610 can be coupled on only one end to prevent the circulation of eddy currents. FIG. 17 shows a detailed view of an embodiment of the thermally conductive layer shown in FIG. 16 where the ends 615 of the traces 610 at or adjacent the inner diameter edge 505 are not interconnected.

Figure 18:
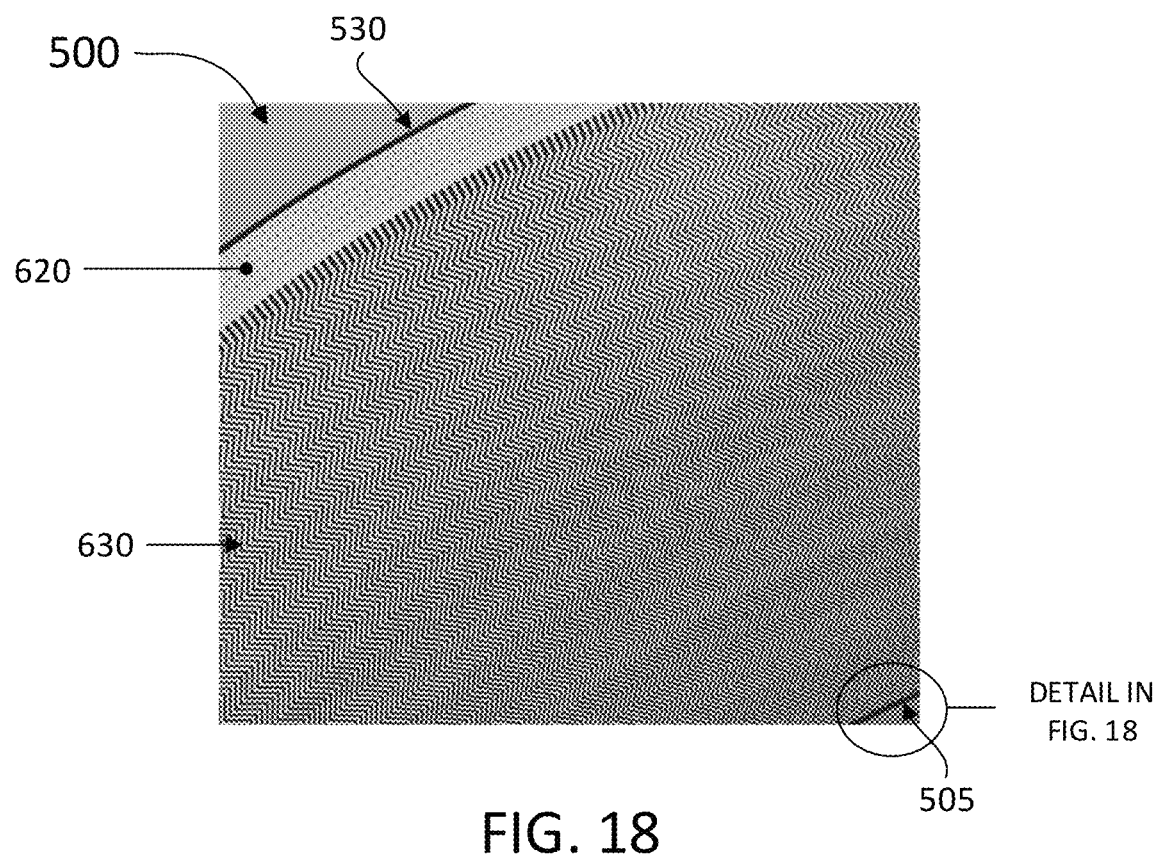
FIG. 18 is a partial axial view of an embodiment of a PCB stator with a thermally conductive layer having non-linear traces.
Figure 19:
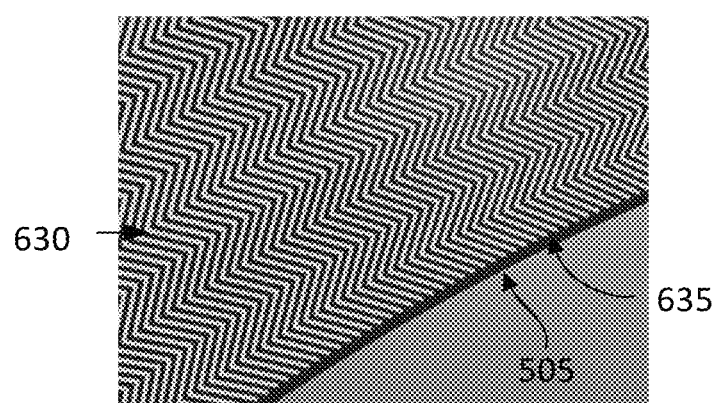
FIG. 19 is an enlarged view of a portion of the embodiment of FIG. 18.

Other embodiments of the thermally conductive traces may have a non-linear layout, such as that shown in FIG. 18. Examples of the traces 630 can include a serrated pattern. Similarly to the embodiment depicted in FIG. 16, the traces 630 can be coupled by a continuous or substantially continuous component 620 of thermally conductive material at or adjacent the outer diameter edge 530 of the PCB stator 500. Some versions of the traces 630 are not coupled at or adjacent the inner diameter edge 505 (FIG. 19), such that the ends 635 of the traces 630 are not interconnected.

Examples of one or more of the external thermally conductive layers 510 depicted in FIGS. 12 through 19 can be galvanically connected to the machine housing 550. Accordingly, the external thermally conductive layers 510 can provide an electrical grounding plane for the PCB stator 500. Such configurations can prevent the occurrence of corona discharge on the surfaces of the PCB stator 500. For example, these embodiments can be useful in applications where the PCB stator 500 operates at a voltage that corona discharge could occur if the grounding plane was not provided.

Whereas the examples depicted in FIGS. 16 and 18 depict external thermally conductive layers with various trace patterns, it should be understood that internal conductive layers can also comprise thermally conductive traces with various trace patterns.

Figure 20:
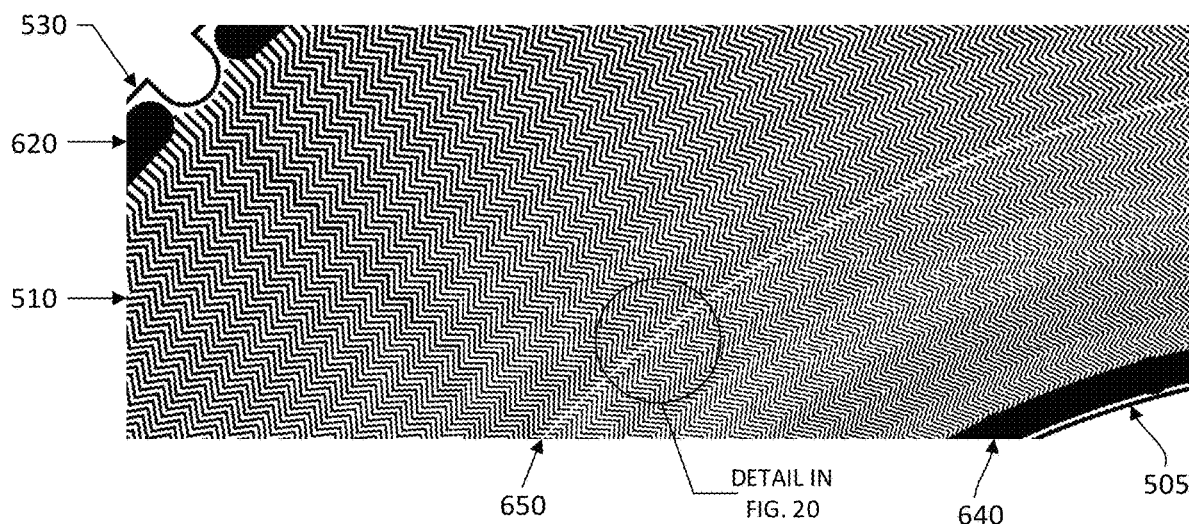
FIG. 20 is an axial view of an embodiment of a PCB stator with a thermally conductive layer having sectioned traces.
Figure 21:
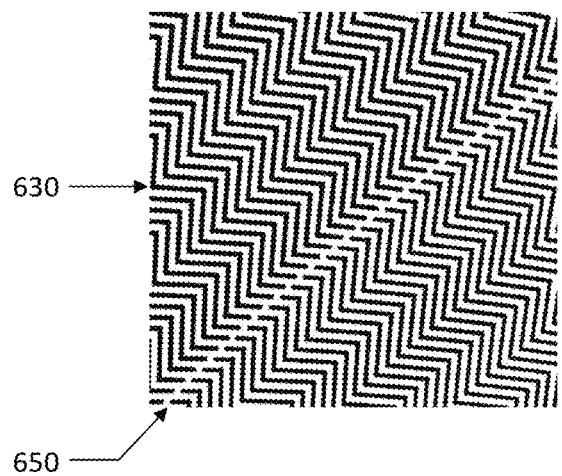
FIG. 21 is an enlarged view of a portion of the embodiment of FIG. 19.

Other embodiments can have substantially continuous areas of thermally conductive material near the inner and the outer edges of the stator PCB, to enable, as an example, the installation of heat sinks, as previously shown in FIGS. 12 and 13. The embodiment depicted in FIGS. 20 and 21 is an example of a PCB stator where the thermally conductive layer 510 has a continuous or substantially continuous thermally conductive material area 640 near the inner edge 505, and a continuous or substantially continuous thermally conductive material area 620 near the outer edge 530. In these versions, the thermally conductive material areas 620 and 640 can establish a circulation path for eddy currents induced in the traces 630 of the thermally conductive layer 510. To prevent the circulation of eddy currents in the thermally conductive layer 510, the traces 630 can be interrupted, such as the discontinuity 650 shown.

Although FIGS. 20 and 21 show the location of the discontinuity 650 at about one-third of the length of the trace 630 from the inner edge 505, other embodiments may have the discontinuity in other locations, such as in the mid-point of the traces 630.

It should be understood that, whereas the embodiment depicted in FIGS. 20 and 21 have the thermally conductive layer traces in a serrated pattern, other embodiments may have straight traces or some other pattern. Moreover, the pattern and features described herein can also be present in internal thermally conductive layers and are also applicable to stator PCBs comprised of a single annular stator structure or comprised of segmented annular stator structure.

Figure 22A:
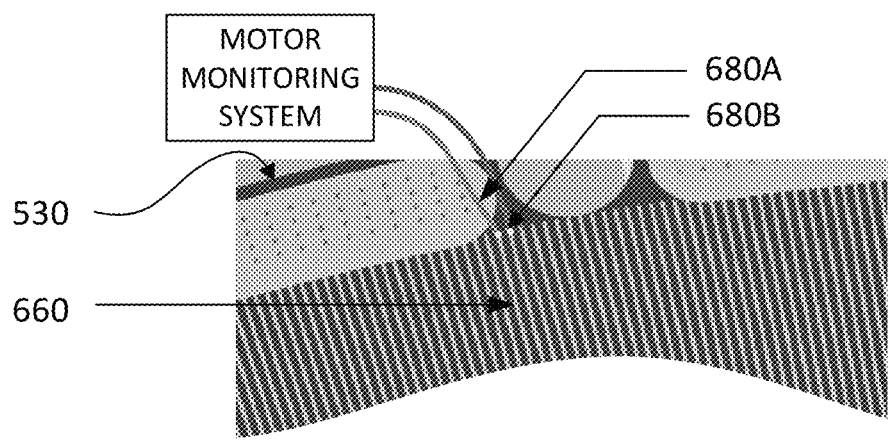
FIGS. 22A and 22B are axial views of an embodiment having some traces interconnected to form a voltage sensor.
Figure 22B:
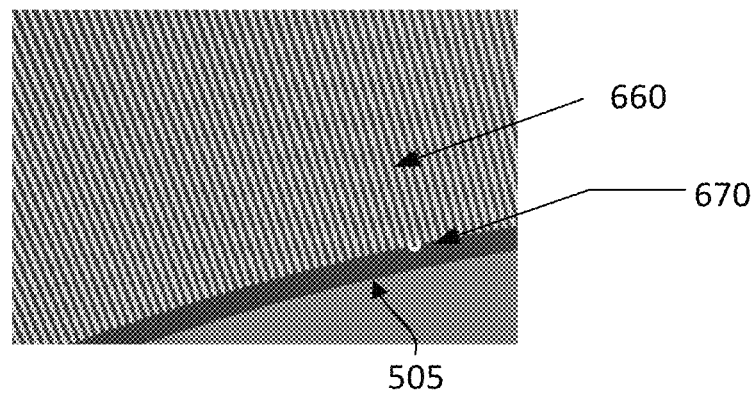

FIGS. 22A and 22B show an embodiment of heat conductive layers where two adjacent traces 660 are connected at the end 670 adjacent the inner edge 505 of the PCB stator, and connected to two separate leads 680A and 680B, respectively, adjacent the outer edge 530 of the PCB stator. The leads 680A, 680B can be connected to a motor monitoring system that can measure the voltage induced on their respective traces 660 during operation. A plurality of such pairs of traces 660 can be included on one or both faces of the PCB stator.

These embodiments can serve to detect if the rotor contacts the stator during operation. In the event of rotor-stator contact, such as due to a mechanical malfunction, the friction between the rotor and the heat conductive traces 660 can grind off one or more of the traces 660, including those coupled to the motor monitoring system. If such an event occurs, the voltage measured by the motor monitoring system coming from the affected traces 660 can drop to a zero value or substantially close to a zero value, which can trigger a motor shut down and/or a warning to the system operator before there is catastrophic damage to the stator or other parts of the machine.

Although FIGS. 22A and 22B illustrate an embodiment of a rotor-stator contact detector in a heat conductive layer with linear traces, the same arrangement can be achieved in a heat conductive layer with non-linear traces, such as the other embodiments described herein.

Figure 23A:
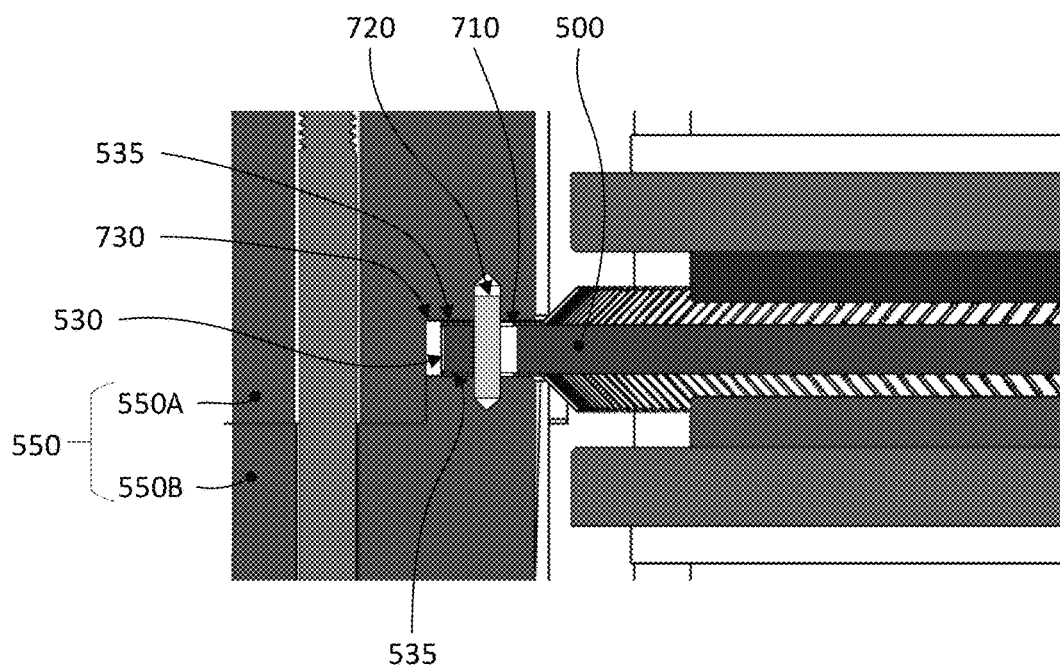
FIGS. 23A and 23B are sectional side and axial views, respectively, of a portion of an embodiment where the PCB stator is clamped between housing sections.
Figure 23B:
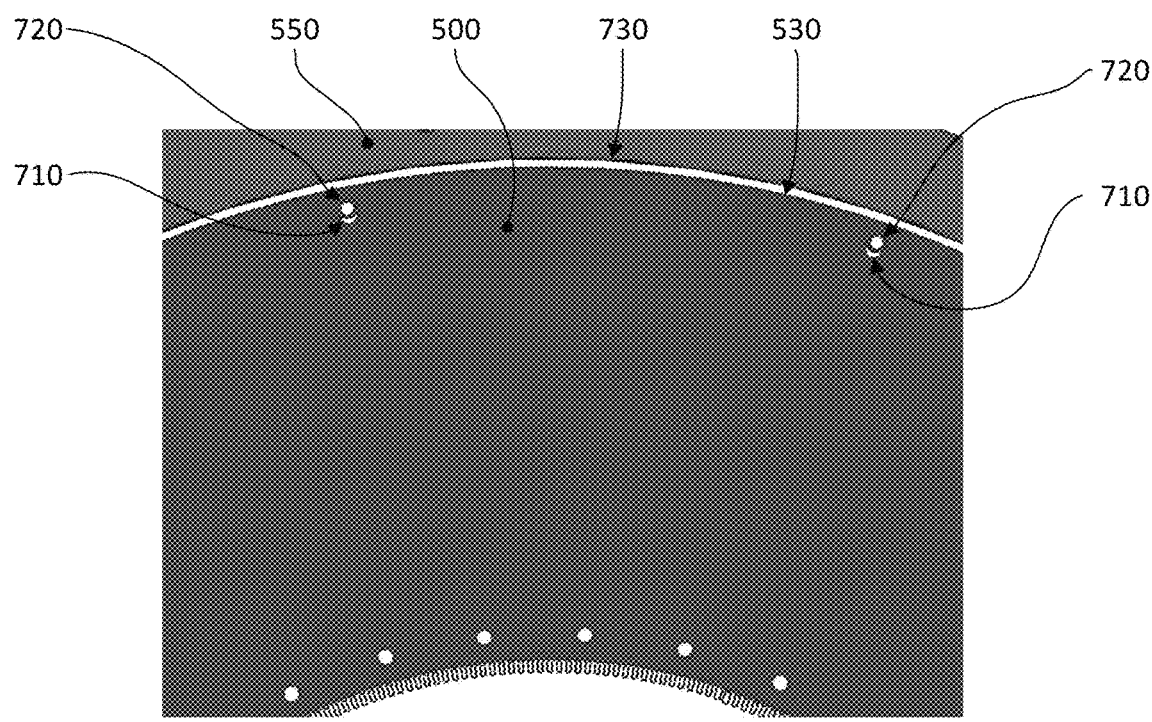

FIGS. 23A and 23B depict an embodiment where the PCB stator 500 can be clamped between two interlocking sections 550A and 550B of the housing 550. In this embodiment, the stator 500 can have heat sinks 535 sandwiched between each of the two major sides of the PCB stator 500 and the respective housing sections 550A, 550B. Furthermore, the PCB stator 500 can have a plurality of mounting holes 710, which can be oblong in shape. In some examples, the mounting holes 710 can substantially radially align (relative to the axis of rotation) with and receive alignment pins 720. The alignment pins 720 can position and secure the PCB stator 500, housing sections 550A, 550B and heat sinks 535 proximately centered with the axis of rotation of the device.

In some embodiments, the alignment pins 720 can be press fit to at least one of the housing sections 550A, 550B. The alignment pins 720 can have a sliding fit with the mounting holes 710 since, in some versions, the mounting holes 710 are elongated. This can be useful when the PCB stator 500 thermally expands during operation. The diameter of the PCB stator 500 can slide and grow into the circumferential gap 730 between the stator perimeter edge 530 and interior of the housing 550.

Although FIGS. 23A and 23B show an embodiment where heat sinks 535 are present on both major sides of the PCB stator 500, other embodiments can have heat sinks on only one side or have no heat sinks at all. Furthermore, although the example shown has alignment pins 720 in all mounting holes 710, other embodiments can have alignment pins 710 in only some of mounting holes 710.

Other embodiments can include one or more of the following items.

1. An axial field rotary energy device, comprising:
   rotors having an axis of rotation, and each rotor comprises a magnet; and
   a stator assembly located axially between the rotors and configured to operate a plurality of electrical phases, the stator assembly comprises a plurality of printed circuit board (PCB) panels, each PCB panel comprises a plurality of layers, each PCB panel is designated to one of the electrical phases, each electrical phase of the stator assembly is configured to be provided by a plurality of the PCB panels, and the PCB panels for each electrical phase are axially spaced apart from and intermingled with each other.

2. The device wherein the PCB panels for each electrical phase are uniformly axially interleaved with each other in a repeating pattern.

3. The device wherein every PCB panel comprises a same number of layers.

4. The device wherein a first layer in at least one of the PCB panels comprises coils with a first number of turns, and a second layer comprises coils with a second number of turns that differs from the first number of turns.

5. The device wherein a first layer in at least one of the PCB panels comprises both coils with a first number of turns and coils with a second number of turns that differs from the first number of turns.

6. The device wherein at least one of the PCB panels comprises a different numbers of layers than another PCB panel.

7. The device wherein a first layer in at least one of the PCB panels comprises coils with a first number of turns, and a second layer comprises coils with a second number of turns that differs from the first number of turns.

8. The device wherein a first layer in a selected PCB panel comprises both coils with a first number of turns and coils with a second number of turns that differs from the first number of turns.

9. The device wherein a second layer said at least one of the PCB panels comprises both coils with a third number of turns and coils with a fourth number of turns that differs from the third number of turns.

10. The device wherein a second layer in the selected PCB panels comprises both coils with a third number of turns and coils with a fourth number of turns that differs from the third number of turns.

11. The device wherein the stator assembly comprises discrete, PCB radial segments that are mechanically and electrically coupled together to form the stator assembly.

12. The device wherein the PCB panels for each electrical phase are uniformly axially interleaved with each other in a repeating pattern.

13. The device wherein every PCB panel comprises a same number of layers.

14. The device wherein a first layer in at least one of the PCB panels comprises coils with a first number of turns, and a second layer comprises coils with a second number of turns that differs from the first number of turns.

15. The device wherein a first layer in at least one of the PCB panels comprises both coils with a first number of turns and coils with a second number of turns that differs from the first number of turns.

16. The device wherein at least one of the PCB panels comprises a different numbers of layers than another PCB panel.

17. The device wherein a first layer in at least one of the PCB panels comprises coils with a first number of turns, and a second layer comprises coils with a second number of turns that differs from the first number of turns.

18. The device wherein a first layer in a selected PCB panel comprises both coils with a first number of turns and coils with a second number of turns that differs from the first number of turns.

19. The device wherein a second layer said at least one of the PCB panels comprises both coils with a third number of turns and coils with a fourth number of turns that differs from the third number of turns.

20. The device wherein a second layer in the selected PCB panels comprises both coils with a third number of turns and coils with a fourth number of turns that differs from the third number of turns.

1. An axial field rotary energy device, comprising:
   rotors having an axis of rotation, and each rotor comprises a magnet; and
   a stator assembly located axially between the rotors, the stator assembly comprises a plurality of printed circuit board (PCB) panels, each PCB panel comprises a plurality of layers and each layer comprises a plurality of coils, each coil comprises radial traces relative to the axis, the radial traces comprise non-linear radial traces coupled by arch traces that are transverse to the non-linear radial traces.

2. The device wherein the non-linear radial traces comprise a serrated pattern.

3. The device wherein an absolute value of an angle between portions that form the non-linear radial traces, relative to a direction of motion of the rotors, is greater than 90 degrees.

4. The device wherein the non-linear radial traces comprise a square wave pattern.

5. The device wherein the non-linear radial traces comprise a sine wave pattern.

6. The device wherein the stator assembly comprises discrete PCB segments.

7. The device wherein the non-linear radial traces comprise a regular repeating pattern.

8. The device wherein the non-linear radial traces comprise an irregular repeating pattern.

9. An axial field rotary energy device, comprising:
   rotors having an axis of rotation, and each rotor comprises a magnet;
   a stator assembly located axially between the rotors, the stator assembly comprises a plurality of printed circuit board (PCB) panels, each PCB panel comprises a plurality of layers and each layer comprises a plurality of coils, each coil comprises radial traces relative to the axis, the radial traces comprise non-linear radial traces coupled by arch traces that are transverse to the non-linear radial traces; and wherein
   the stator assembly comprises discrete, PCB radial segments that are mechanically and electrically coupled together to form the stator assembly.

10. The device wherein the non-linear radial traces comprise a serrated pattern.

11. The device wherein an absolute value of an angle between portions that form the non-linear radial traces, relative to a direction of motion of the rotors, is greater than 90 degrees.

12. The device wherein the non-linear radial traces comprise a square wave pattern.

13. The device wherein the non-linear radial traces comprise a sine wave pattern.

14. The device wherein the non-linear radial traces comprise a regular repeating pattern.

15. The device wherein the non-linear radial traces comprise an irregular repeating pattern.

16. An axial field rotary energy device, comprising:
rotors having an axis of rotation, and each rotor comprises a magnet; and
a stator assembly located axially between the rotors, the stator assembly comprises a plurality of printed circuit board (PCB) panels, each PCB panel comprises a plurality of layers and each layer comprises a plurality of coils, each coil comprises radial traces relative to the axis, the radial traces comprise non-linear radial traces coupled by arch traces that are transverse to the non-linear radial traces;
the non-linear radial traces comprise a serrated pattern; and
an absolute value of an angle between portions that form the serrated pattern, relative to a direction of motion of the rotors, is greater than 90 degrees.

17. The device wherein the stator assembly comprises discrete, PCB radial segments that are mechanically and electrically coupled together to form the stator assembly.

1a. An axial field rotary energy device, comprising:
rotors having an axis of rotation, and each rotor comprises a magnet; and
a stator assembly located axially between the rotors, the stator assembly comprises a plurality of printed circuit board (PCB) panels, each PCB panel comprises a plurality of layers, each layer comprises a plurality of coils, and at least one outer portion of the stator assembly comprises an external thermally conductive layer that extends from an inner diameter portion to an outer diameter portion of the stator assembly.

1b. An axial field rotary energy device, comprising:
rotors having an axis of rotation, and each rotor comprises a magnet;
a stator assembly located axially between the rotors, the stator assembly comprises a plurality of printed circuit board (PCB) panels, each PCB panel comprises a plurality of layers, each layer comprises a plurality of coils, and at least one outer portion of the stator assembly comprises an external thermally conductive layer that extends from an inner diameter portion to an outer diameter portion of the stator assembly; and
each PCB panel comprises discrete, PCB radial segments that are mechanically and electrically coupled together to form the respective PCB panels.

2. The device wherein both major outer sides of the stator assembly comprise respective external thermally conductive layers that are thermally coupled to each other.

3. The device wherein the external thermally conductive layers are thermally coupled with a plurality of vias.

4. The device wherein at least one surface of each external thermally conductive layer comprises a treatment to increase emissivity thereof.

5. The device wherein the vias are located adjacent the inner and outer diameter portions.

6. The device further comprising heat sinks comprising thermally conductive material coupled adjacent at least one of the inner and outer diameter portions.

7. The device wherein each heat sink comprises discrete heat sink segments.

8. The device wherein each heat sink comprises fingers that extend from a plane of the heat sink.

9. The device wherein some of the fingers are oriented at a first angle and other ones of the fingers are oriented at a second angle that differs from the first angle.

10. The device further comprising an internal thermally conductive layer located inside the stator assembly.

11. The device wherein the internal thermally conductive layer is thermally coupled to the external thermally conductive layer with vias.

12. The device wherein the vias are located adjacent at least one of the inner and outer diameter portions.

13. The device further comprising heat sinks comprising thermally conductive material coupled adjacent to at least one of the inner and outer diameter portions.

14. The device wherein each heat sink comprises discrete heat sink segments.

15. The device wherein each heat sink comprises fingers that extend from a plane of the heat sink.

16. The device wherein some of the fingers are oriented at a first angle and other ones of the fingers are oriented at a second angle that differs from the first angle.

17. The device further comprising a plurality of internal thermally conductive layers.

18. The device wherein the internal thermally conductive layers are evenly spaced apart from each other.

19. The device wherein the internal thermally conductive layers are unevenly spaced apart from each other.

20. The device wherein the thermally conductive layers comprise radial thermal traces that are thermally coupled at ends thereof adjacent the outer diameter portion with a continuous thermal coupler.

21. The device wherein the continuous thermal coupler comprises an internal continuous thermal coupler.

22. The device wherein the continuous thermal coupler comprises an external continuous thermal coupler.

23. The device wherein the continuous thermal coupler comprises internal and external continuous thermal couplers.

24. The device wherein the internal and external continuous thermal couplers are thermally coupled together with vias that are thermally conductive.

25. The device wherein the radial thermal traces comprise a linear pattern.

26. The device wherein the radial thermal traces comprise a non-linear pattern.

27. The device wherein the radial thermal traces comprise a serrated pattern.

28. The device wherein the radial thermal traces comprise discontinuities that disrupt circulation of eddy currents.

29. The device wherein the radial thermal traces are thermally coupled at ends thereof adjacent the inner diameter portion with a continuous thermal coupler.

30. The device wherein the thermally conductive traces have a non-linear pattern.

31. The device wherein the thermally conductive traces have a serrated pattern.

32. The device where at least one pair of radial thermal traces is not connected to any thermal couplers, and the at least one pair of radial thermal traces is connected adjacent the inner diameter portion of the stator assembly and are further connected to a voltage sensor of a motor monitoring system.

33. The device wherein the external thermally conductive layers are galvanically coupled to a machine housing of the device and configured to provide electrical grounding for the stator assembly.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom," and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated degrees or at other orientations) and the spatially relative descriptions used herein interpreted accordingly.

This written description uses examples to disclose the embodiments, including the best mode, and also to enable those of ordinary skill in the art to make and use the invention. The patentable scope is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

It can be advantageous to set forth definitions of certain words and phrases used throughout this patent document. The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, can mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items can be used, and only one item in the list can be needed. For example, "at least one of: A, B, and C" includes any of the following combinations: A, B, C, A and B, A and C, B and C, and A and B and C.

Moreover, various functions described herein can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), solid state drive (SSD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Also, the use of "a" or "an" is employed to describe elements and components described herein. This is done merely for convenience and to give a general sense of the scope of the invention. This description should be read to include one or at least one and the singular also includes the plural unless it states otherwise.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function.

Benefits, other advantages, and solutions to problems have been described above with regard to specific embodiments. However, the benefits, advantages, solutions to problems, and any feature(s) that can cause any benefit, advantage, or solution to occur or become more pronounced are not to be construed as a critical, required, sacrosanct or an essential feature of any or all the claims.

After reading the specification, skilled artisans will appreciate that certain features which are, for clarity, described herein in the context of separate embodiments, can also be provided in combination in a single embodiment. Conversely, various features that are, for brevity, described in the context of a single embodiment, can also be provided separately or in any subcombination. Further, references to values stated in ranges include each and every value within that range.

What is claimed is:

1. An axial field rotary energy device, comprising:
   rotors having an axis of rotation, and each rotor comprises a magnet;
   a stator assembly located axially between the rotors, the stator assembly comprises a plurality of printed circuit board (PCB) panels, each PCB panel comprises a plurality of layers, each layer comprises a plurality of coils, and at least one outer portion of the stator assembly comprises an external thermally conductive layer that extends from an inner diameter portion to an outer diameter portion of the stator assembly;
   both major outer sides of the stator assembly comprise respective external thermally conductive layers that comprise radial thermal traces that are thermally coupled to each other; and wherein
   the external thermally conductive layers are galvanically coupled to a machine housing of the device and configured to provide electrical grounding for the stator assembly.

2. The device of claim 1, wherein at least some of the radial thermal traces comprise discontinuities that can disrupt circulation of eddy currents.

3. An axial field rotary energy device, comprising:
   rotors having an axis of rotation, and each rotor comprises a magnet; and
   a stator assembly located axially between the rotors, the stator assembly comprises a plurality of printed circuit board (PCB) panels, each PCB panel comprises a plurality of electrically conductive layers, each electrically conductive layer comprises a plurality of coils, and at least one outer portion of the stator assembly comprises an external thermally conductive layer that is separate from the electrically conductive layers and extends continuously in a radial direction from an inner diameter portion to an outer diameter portion of the stator assembly.

4. The device of claim 3, wherein both major outer sides of the stator assembly comprise respective external thermally conductive layers that are thermally coupled to each other.

5. The device of claim 4, wherein the external thermally conductive layers are thermally coupled with a plurality of vias.

6. The device of claim 2, wherein the thermally conductive traces have a non-linear pattern.

7. The device of claim 2, wherein the thermally conductive traces have a serrated pattern.

8. The device of claim 5, wherein the vias are located adjacent the inner and outer diameter portions.

9. The device of claim 4, wherein at least one surface of each external thermally conductive layer comprises a treatment to increase emissivity thereof.

10. The device of claim 3, further comprising heat sinks comprising thermally conductive material coupled adjacent at least one of the inner and outer diameter portions.

11. The device of claim 10, wherein each heat sink comprises discrete heat sink segments.

12. The device of claim 10, wherein each heat sink comprises fingers that extend from a plane of the heat sink.

13. The device of claim 12, wherein some of the fingers are oriented at a first angle and other ones of the fingers are oriented at a second angle that differs from the first angle.

14. The device of claim 3, further comprising an internal thermally conductive layer located inside the stator assembly.

15. The device of claim 14, wherein the internal thermally conductive layer is thermally coupled to the external thermally conductive layer with vias.

16. The device of claim 15, wherein the vias are located adjacent at least one of the inner and outer diameter portions.

17. The device of claim 14, further comprising heat sinks comprising thermally conductive material coupled adjacent to at least one of the inner and outer diameter portions.

18. The device of claim 17, wherein each heat sink comprises discrete heat sink segments.

19. The device of claim 18, wherein each heat sink comprises fingers that extend from a plane of the heat sink.

20. The device of claim 19, wherein some of the fingers are oriented at a first angle and other ones of the fingers are oriented at a second angle that differs from the first angle.

21. The device of claim 3, further comprising a plurality of internal thermally conductive layers.

22. The device of claim 21, wherein the internal thermally conductive layers are evenly spaced apart from each other.

23. The device of claim 21, wherein the internal thermally conductive layers are unevenly spaced apart from each other.

24. The device of claim 3, wherein the external thermally conductive layer comprises radial thermal traces that are thermally coupled at ends thereof to a substantially continuous area of thermally conductive material adjacent to an outer edge of the PCB.

25. The device of claim 24, wherein the substantially continuous area of thermally conductive material is adjacent to an inner edge of the PCB.

26. The device of claim 24, further comprising a second substantially continuous area of thermally conductive material adjacent to an inner edge of the PCB.

27. The device of claim 26, wherein the external thermally conductive layer is thermally coupled to a second external thermally conductive layer with vias that are thermally conductive.

28. The device of claim 24, wherein the external thermally conductive layer comprises radial thermal traces that comprise a linear pattern.

29. The device of claim 24, wherein the external thermally conductive layer comprises radial thermal traces that comprise a non-linear pattern.

30. The device of claim 24, wherein the external thermally conductive layer comprises radial thermal traces that comprise a serrated pattern.

31. The device of claim 24, wherein at least one pair of the radial thermal traces is not connected to any other thermal traces or substantially continuous area of thermally conductive material, and the at least one pair of radial thermal traces is connected adjacent to the inner diameter portion of the stator assembly and is further connected to a voltage sensor of a motor monitoring system.

* * * * *